United States Patent [19]

Jacob et al.

[11] Patent Number: 4,986,183

[45] Date of Patent: Jan. 22, 1991

[54] METHOD AND APPARATUS FOR CALIBRATION OF ELECTRONIC DELAY DETONATION CIRCUITS

[75] Inventors: Merritt Jacob, Allentown; Gerald L. Oswald, New Ringgold; Glen P. Goffin, II, Newtown, all of Pa.

[73] Assignee: Atlas Powder Company, Dallas, Tex.

[21] Appl. No.: 426,081

[22] Filed: Oct. 24, 1989

[51] Int. Cl.$^5$ .............................................. F42C 15/40
[52] U.S. Cl. ...................................... 102/200; 102/215
[58] Field of Search ............... 102/200, 301, 311, 215, 102/217

[56] References Cited

U.S. PATENT DOCUMENTS

| | | | |
|---|---|---|---|
| 3,500,746 | 3/1968 | Ambrosini | 102/215 |
| 3,646,371 | 2/1972 | Flad | 307/605 |
| 3,851,589 | 12/1974 | Meyer | 102/215 |
| 4,095,527 | 6/1978 | Moore, III | 102/426 |
| 4,136,617 | 1/1979 | Fowler | 102/220 |
| 4,145,970 | 3/1979 | Hedberg et al. | 102/218 |
| 4,157,069 | 6/1979 | Gustafsson et al. | 102/200 |
| 4,311,096 | 1/1982 | Oswald | 102/202.13 |
| 4,395,950 | 8/1983 | Oswald | 102/200 |
| 4,419,933 | 12/1983 | Kirby et al. | 102/206 |
| 4,424,745 | 1/1984 | Magorian et al. | 102/215 |
| 4,445,435 | 5/1984 | Oswald | 102/215 |
| 4,572,288 | 2/1986 | Kinley | 166/63 |
| 4,586,437 | 5/1986 | Miki et al. | 102/220 |
| 4,632,031 | 12/1986 | Jarrott et al. | 102/200 |
| 4,633,779 | 1/1987 | Biggs et al. | 102/215 |
| 4,644,864 | 2/1987 | Komorowski et al. | 102/215 |
| 4,646,640 | 3/1987 | Florin et al. | 102/217 |
| 4,674,047 | 6/1987 | Tyler et al. | 364/423 |
| 4,685,396 | 8/1987 | Birse et al. | 102/506 |
| 4,712,477 | 12/1987 | Aikou et al. | 102/206 |
| 4,730,558 | 3/1988 | Florin et al. | 102/218 |
| 4,825,765 | 5/1989 | Ochi et al. | 102/206 |
| 4,848,232 | 7/1989 | Kurokawa et al. | 102/200 |
| 4,860,653 | 8/1989 | Abouav | 102/200 |

FOREIGN PATENT DOCUMENTS 0208480  1/1987  European Pat. Off. ............ 102/215

*Primary Examiner*—Charles T. Jordan
*Assistant Examiner*—Rochelle Lieberman
*Attorney, Agent, or Firm*—Richards, Medlock & Andrews

[57] ABSTRACT

In the field of blasting, it is often desirable to ignite explosives at various relative times. Such delayed ignition can have advantages in better break up of rock and reduced ground vibration. A principle problem in using the time delay technique is the accuracy rate of a local oscillator which measures the delay time for each of the delay circuits. In the described system, a calibration interval, independent of any delay time, is transmitted from a control unit concurrently to each of the delay circuits wherein each delay circuit counts the output of its local oscillator during the calibration interval. This local oscillator output is then compared to a predetermined reference count, either at the delay circuit or at the control unit, and a correction factor is established. This correction factor is then applied to a delay count for the individual delay circuit. The delay count is modified to produce a corrected delay count that is utilized individually within the delay circuits to count the output of the corresponding local oscillator for determining the delay time until ignition. This technique utilizes the precise oscillator at the control unit to substantially eliminate the delay errors due to the less precise oscillators within the delay circuits.

15 Claims, 13 Drawing Sheets

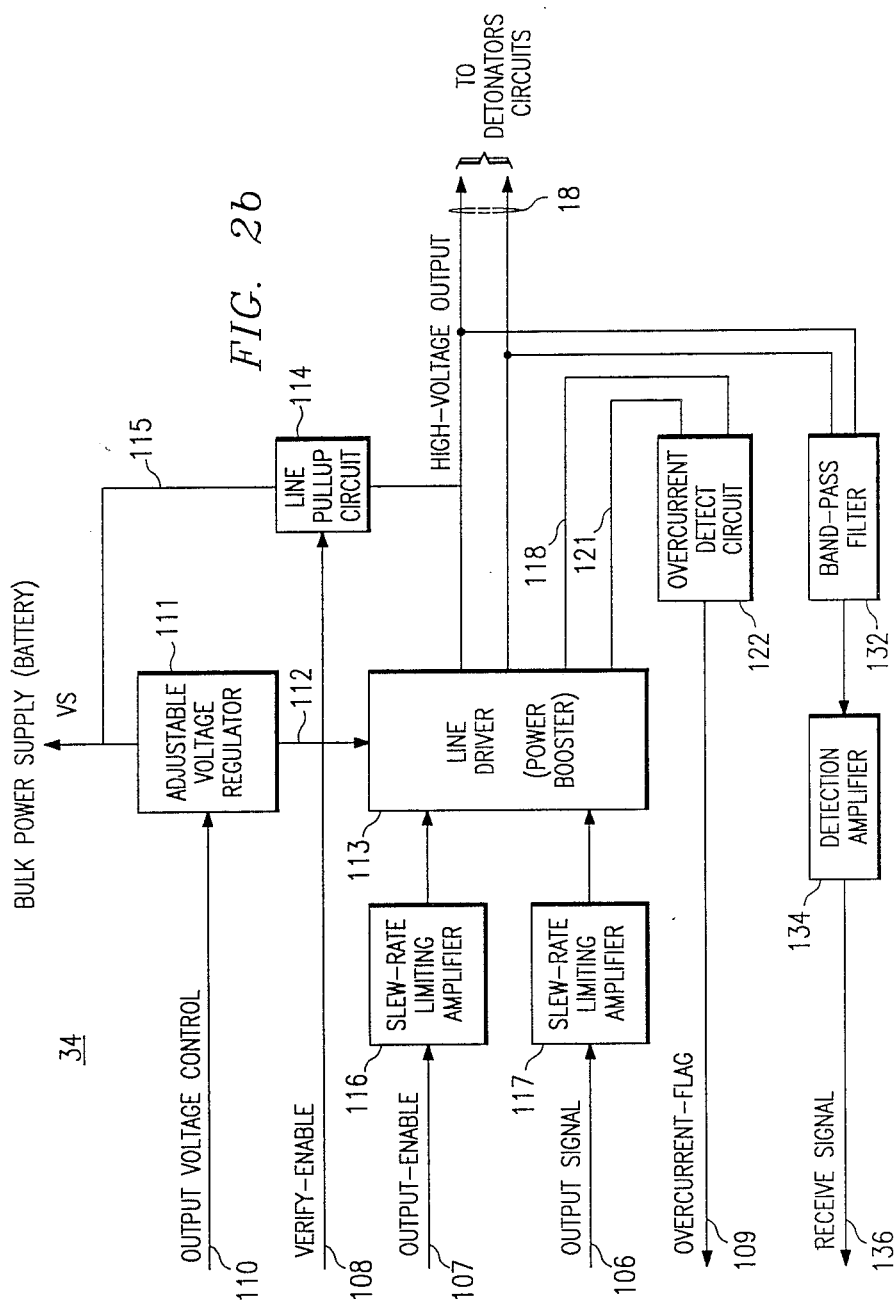

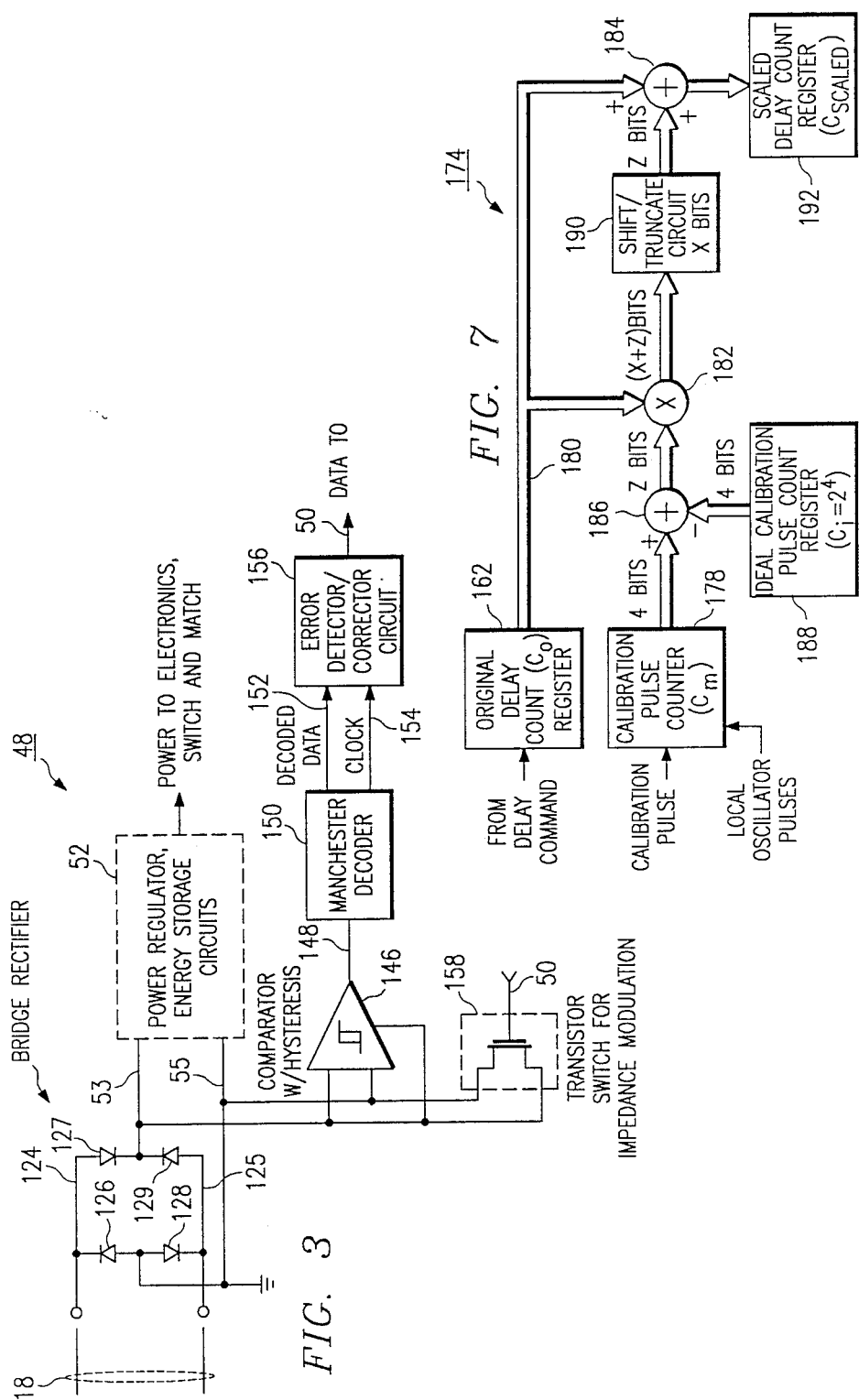

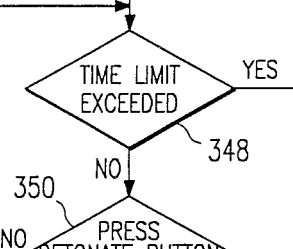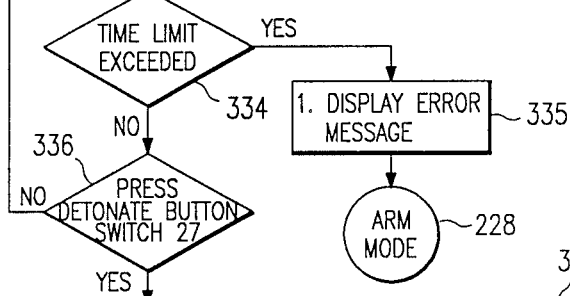

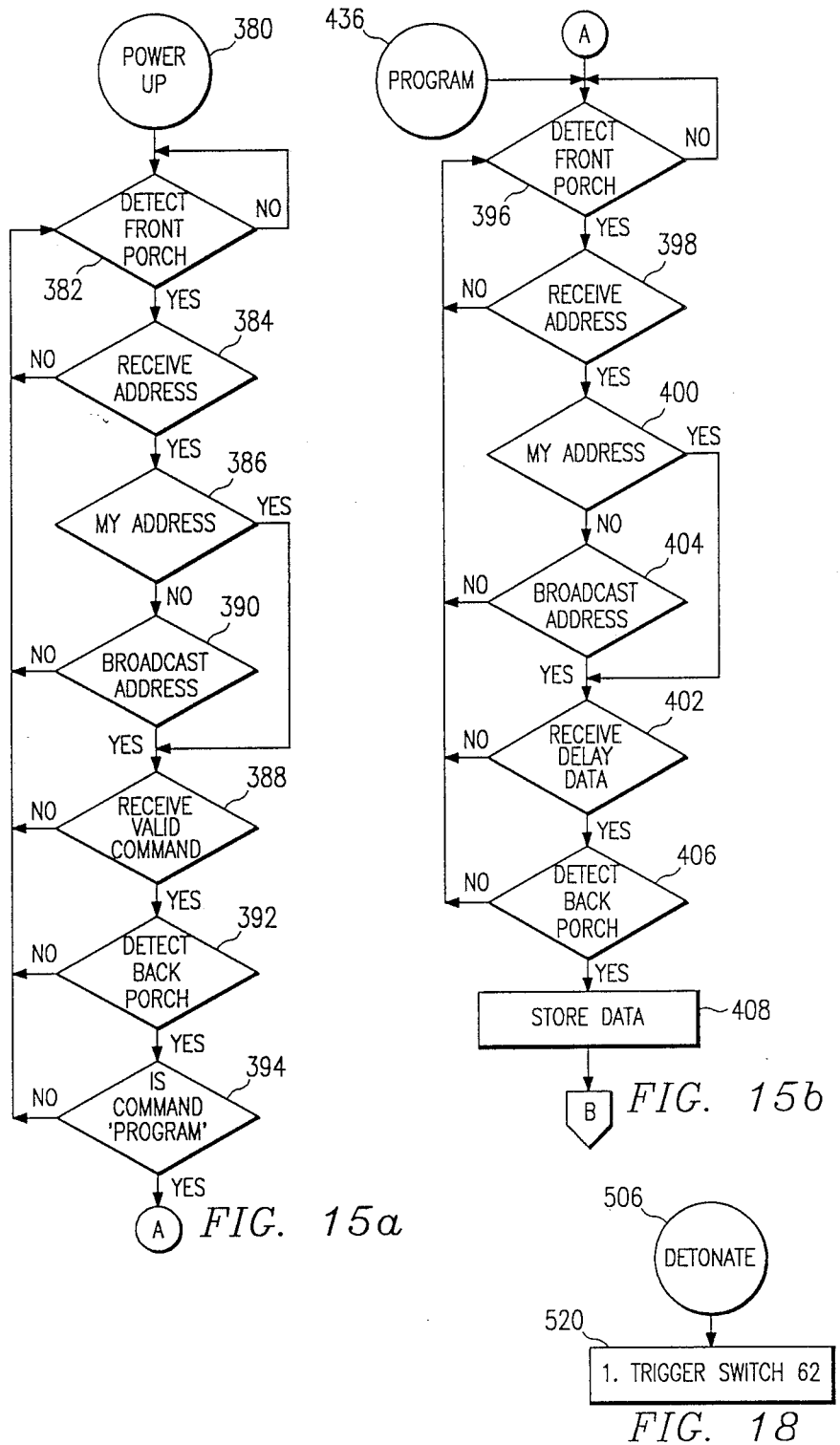

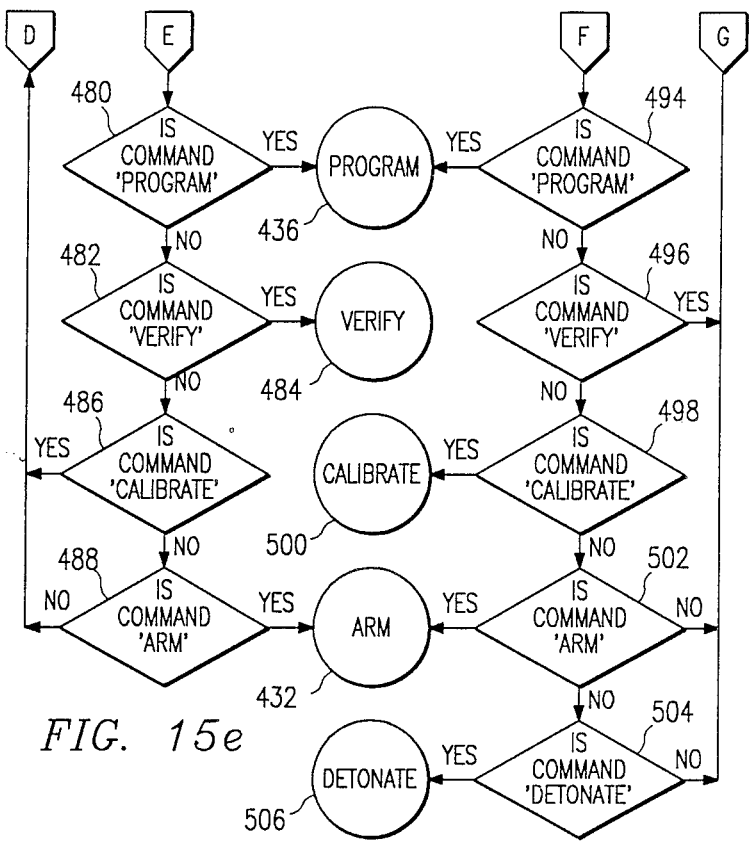
FIG. 15e
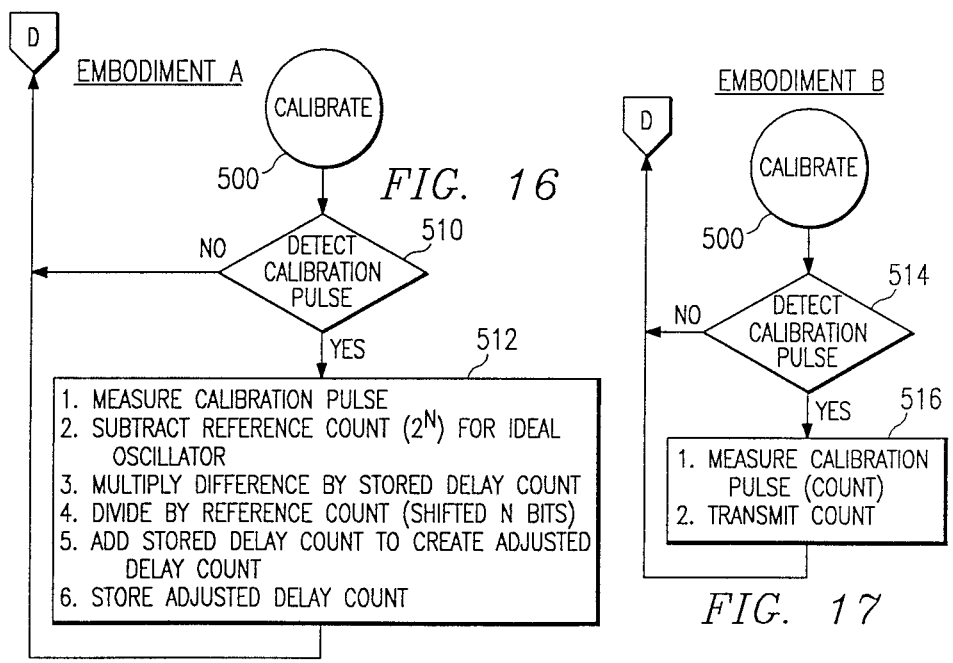
FIG. 16
FIG. 17

METHOD AND APPARATUS FOR CALIBRATION OF ELECTRONIC DELAY DETONATION CIRCUITS

FIELD OF THE INVENTION

The present invention pertains in general to the use of electronic circuits for the control of explosives and in particular to the precise calibration of time delay ignition circuits.

BACKGROUND OF THE INVENTION

In blasting operations, it is becoming increasingly important to efficiently utilize the blasting power of the explosives. It is important to achieve the maximum breakage of rock into the correct sizes for a given amount of explosive material. It is further becoming increasingly important to minimize the effects of blasting on nearby structures by reducing the amplitude of ground vibration produced by a blast. The principle method for achieving these objectives is to time the ignition of a plurality of explosive units which are placed at selected locations within an area of operation. This separates the total weight of explosives over the area and makes it possible to separate the time of ignition between the explosive units. Such separation can improve breakage and reduce the peak ground vibrations. The delay time is measured on the order of milliseconds.

Both electric and nonelectric delay blasting caps and circuits have been developed. The nonelectric units are typically based upon the burning time for a pyrotechnic mixture. However, such burning time has the limitation in its accuracy. This limitation of accuracy prevents the optimum timing of the ignition events.

Numerous electronic detonation circuits have been proposed to achieve greater accuracy over pyrotechnic devices. Representative ones of such circuits are shown in the following patents. U.S. Pat. No. 4,825,765 to Ochi et al., U.S. Pat. No. 4,730,558 to Florin et al., U.S. Pat. No. 4,712,477 to Aikou et al., U.S. Pat. No. 4,646,640 to Florin et al., U.S. Pat. No. 4,633,779 to Bitts et al., U.S. Pat. No. 4,632,031 to Jarrott et al., U.S. Pat. No. 4,586,437 to Miki et al., U.S. Pat. No. 4,445,435 to Oswald, U.S. Pat. No. 4,395,950 to Oswald, U.S. Pat. No. 4,324,182 to Kirby et al., U.S. Pat. No. 4,328,751 to Oswald, U.S. Pat. No. 4,311,096 to Oswald, U.S. Pat. No. 4,145,970 to Hedberd et al., U.S. Pat. No. 4,136,617 to Fowler, U.S. Pat. No. 4,095,527 to Moore, III, U.S. Pat. No. 3,851,589 to Meyer.

A principal problem encountered in the use of electronic delay detonators is the accuracy of the clock signal within the delay circuit itself. There are numerous constraints upon the use of a local oscillator within the delay circuits. First, the oscillator must be relatively inexpensive to justify the one time use in an explosives application. Further, such an oscillator should not be subjected to rate variations as a result of changing pressures, which will be experienced when one unit receives the pressure wave from the ignition of another unit. Further, fluctuations in ambient temperature, humidity and pressure can cause an oscillator to vary in its rate.

Various techniques have been proposed for calibrating local oscillators in electronic delay detonator circuits. These are set forth in the following patents. U.S. Pat. No. 4,674,047 to Tyler et al., U.S. Pat. No. 4,419,933 to Kirby et al., and U.S. Pat. No. 3,500,746 to Abrosini et al.

It can therefore be seen that it is important to have a method for calibrating the local oscillator within a delay circuit so that accurate delay times can be achieved while at the same time doing so in such a manner that is reliable and rapid.

SUMMARY OF THE INVENTION

A selected embodiment of the present invention is a method for calibrating the delay time for a plurality of delay ignition circuits which are connected to a control unit in a delay detonation system. In a first step, the control unit transmits a respective delay count to each of the ignition circuits for specifying the time delay for each of the circuits. Next, a precision calibration pulse is transmitted from the control unit concurrently to all of the ignition circuits for the purpose of time calibration. At each of the delay ignition circuits, the output of a local oscillator is counted during the period of the calibration pulse received from the control unit. Each delay ignition circuit then produces a corrected delay count which is a function of the output count from the local oscillator, the delay count received at that ignition circuit as well as a predetermined reference count. The corrected delay count serves to determine the delay ignition time for the corresponding delay ignition circuit.

A further embodiment of the present invention, a precise calibration pulse is transmitted from the control unit to each of the delay ignition circuits. Each circuit counts the output of its local oscillator during the calibration pulse. Each local oscillator output count is then transmitted from the corresponding delay ignition circuit back to the control unit. The control unit then calculates a corrected delay time for each of the delay ignition circuits and transmits the corrected delay times to the respective delay ignition circuits.

A still further aspect of the present invention is a blasting system having a control unit which sends commands to adhered delay ignition circuits for verifying operation, calibration, setting delay times, arming and commanding detonation.

BRIEF DESCRIPTION OF THE DRAWINGS

For a more complete understanding of the present invention and the advantages thereof, reference is now made to the following description taken in conjunction with the accompanying drawings in which:

FIGS. 2a and 2b are block diagrams of the communication circuit used within the control unit shown in FIG. 1;

FIG. 3 is a block diagram of the communication circuit used within the delay circuit shown in FIG. 1;

FIG. 7 is a circuit for carrying out a scale operation for the delay count produced in a detonator delay circuit;

FIG. 13 is a flow diagram which describes the first embodiment blast mode operation of the control unit;

FIGS. 14a and 14b are flow diagrams which describes the second embodiment blast mode operation of the control unit;

FIGS. 15a, 15b, 15c, 15d and 15e are flow diagrams which describe the operations of a delay ignition circuit following power up;

FIG. 16 is a flow diagram which describes the first embodiment mode of operation for a delay ignition circuit;

FIG. 17 is a flow diagram which describes the second embodiment mode of operation for a delay ignition circuit; and FIG. 18 is a flow diagram illustrating the detonate flow operation for the present invention.

DETAILED DESCRIPTION

Figure 1:
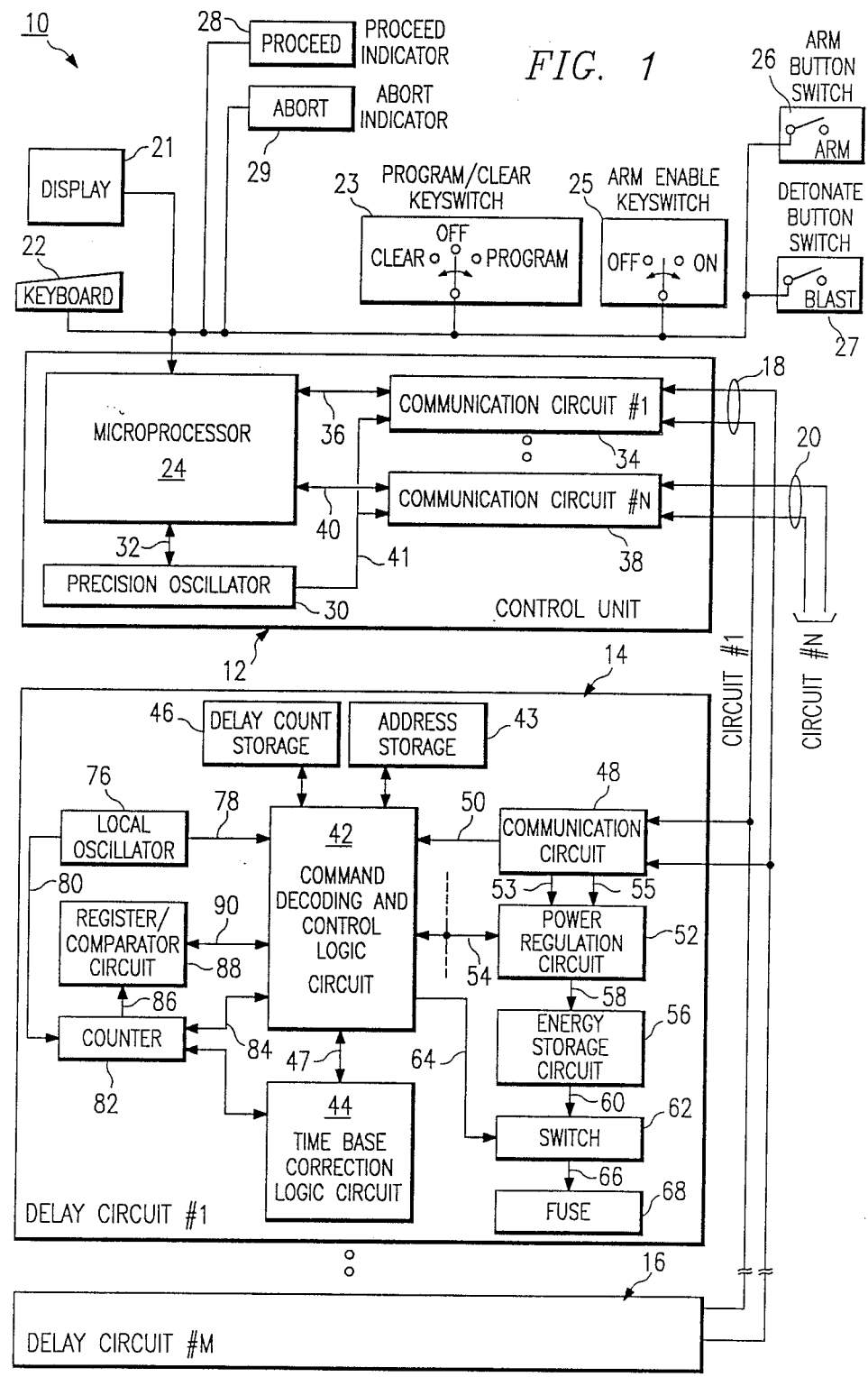
FIG. 1 is a block diagram of a control unit and delay circuit in accordance with the present invention.

Referring now to FIG. 1, there is shown a delay detonation system 10 in accordance with the present invention. The system 10 includes a control unit 12 and a delay ignition circuit 14. The control circuit 12 can be connected to multiple delay circuits, such as 14 and the additional delay circuits are illustrated as, for example, circuit 16. The control unit 12 is connected to the delay circuits 14 and 16 through a two-wire line 18. The delay circuits 14 and 16 are connected in parallel. The control unit 12 may be connected to multiple groups of delay circuits by additional two-wire lines, such as 20.

Connected to a microprocessor 24 in the control unit 12 are operator interface devices which include a display 21, keyboard 22, program/clear keyswitch 23, arm enable switch 25, arm button switch 26 and blast button switch 27. The display 21 and keyboard 22 operate in a conventional manner with a microprocessor.

Each of the switches 26 and 27 has an associated light which can be illuminated to indicate that the corresponding switch is enabled.

The program/clear keyswitch 23 has three positions. The center position is off, the left position is clear, and the right position is program. The function of this switch essentially is to select the program mode of operation which sets up the delays for the delay circuits.

The arm enable switch 25 has two positions. These are OFF and ON. This switch is utilized for enabling either the arm or the blast function. The arm button switch 26 is a normally open switch which is closed to activate the arm function. The blast button switch 27 is normally open and is closed to activate the blast function.

The microprocessor 24 can be, for example, a model 80C31 made by Intel Corp. There is used in conjunction with the microprocessor 24 a control program which is stored in read-only memory which is either connected to or a part of the microprocessor 24.

A proceed indicator 28 and an abort indicator 29 are lamps which are connected to the microprocessor 24 and can be selectively illuminated by the microprocessor 24.

A precision, high quality, oscillator 30 such as an oven-controlled crystal oscillator, is connected by a line 32 to the microprocessor 24. A selected oscillation rate for the oscillator 30 is 10 mhz.

Further connected to the microprocessor 24 is a communication circuit 34 which is connected to the microprocessor 24 through a bi-directional line 36. Other similar communication circuits such as 38, may also be connected through respective lines, such as 40 to the microprocessor 24. The output of the oscillator 30 is also provided to the communication circuits 34 and 38 through a line 41.

The delay circuit 14 includes a command decoding and control logic circuit 42 which directs the operation of the delay unit 14 and works in conjunction with a programmable read only memory address storage 43 which stores an address for the particular circuit 14. The address for a particular delay circuit can be placed in the address storage 43 in any one of several methods. The particular address can be placed in the address storage 43 at the time of manufacture of the integrated circuit. It can be programmed by an external application of energy, such as by opening links with the laser beam. It can further be installed by opening small fuses which are included in the storage 43. It may also take the form of electrical storage, such as the use of erasable programmable read only memory (EPROM). The address can be written into the address store by operation of the control unit 12 or by connecting the wire line pair of the delay circuit to an instrument designed for inputting the addresses into the delay circuits.

A communication circuit 48 is connected through a line 50 to the logic circuit 42. Power output lines 53 and 55 extend from the communication circuit 48 to a power regulation circuit 52. Circuit 52 is connected through a line 54 for supplying power to all active internal circuitry.

An energy storage circuit 56 is connected to receive power through a line 58 from the power regulation circuit 52. Circuit 56 is preferably a capacitor, but can also be a chemical energy store such as a battery. The output from the energy storage circuit 56 is transmitted through a line 60 to a switch 62 which is itself controlled through a line 64 from the circuit 42. The output from the switch 62 is transmitted through a line 66 to a fuse 68. When the fuse 68 receives energy from the energy storage circuit 56 by activation of the switch 62, the fuse is energized to activate a nearby explosive charge (not shown). The fuse 68 can be, for example, a match, a bridge wire, a resistive link or equivalent element.

The delay circuit 14 includes a local oscillator 76, which is connected through a line 78 to the circuit 42. The oscillator 76 produces a clock signal which is transmitted through a line 80 to a counter 82. A bi-directional line 84 further connects the counter 82 with the circuit 42. An output of the counter 82 is connected through a line 86 to a register/comparator circuit 88. The control signals for circuit 88 and output of the circuit 88 are carried through a line 90 which is connected to the circuit 42.

In a preferred embodiment of the invention, each of the functional blocks within the delay circuit 14, are fabricated as a part of a single application specific integrated circuit (ASIC). The switch 62 and the fuse 68 may or may not be incorporated in the ASIC. The switch 62 may be a discrete SCR switch, and the fuse 68 may be a bridge wire fuse device.

Figure 2A:
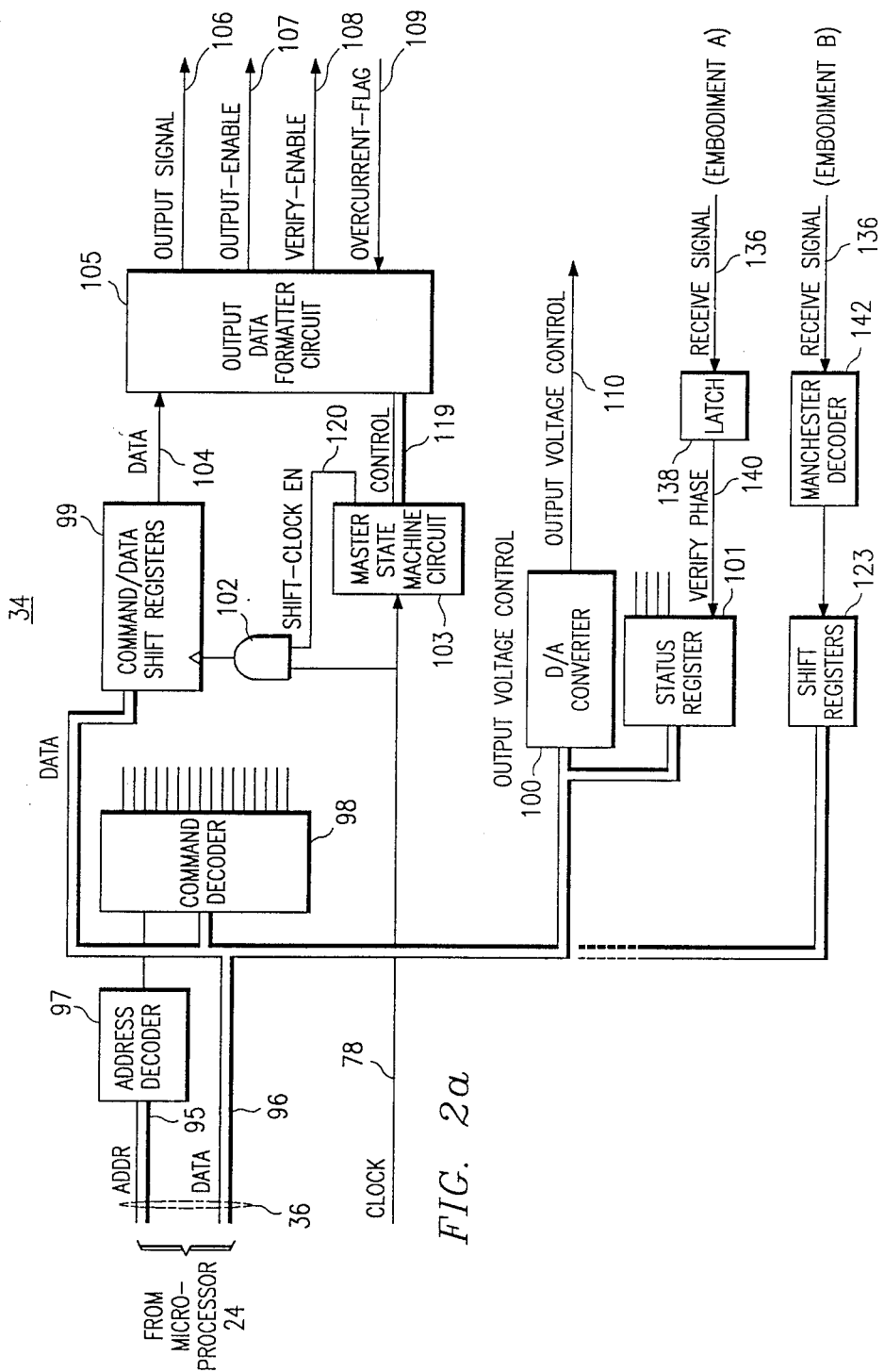

The communication circuit 34 of control unit 12 is shown in a detailed block diagram in FIGS. 2a and 2b. The microprocessor 24 is connected through line 36 to the communication circuit 34. The line 36 includes an address bus 95 and a data bus 96. The address bus is provided to an address decoder 97 which provides a decoded output to a command decoder 98. The outputs of the decoder 98 are provided to the various circuits within the communication circuit 34 to direct the operation of those circuits as described below.

The bidirectional data bus 96 is connected to command/data shift registers 99, a D/A (digital to analog) converter 100, a status register 101 and shift registers 123.

The clock signal at line 78 is input to an AND gate 102 and a master state machine circuit 103. The output of the circuit 103 is transmitted through a control line 119 as a control input to an output data formatter circuit 105. A further output of the circuit 103 is transmitted through a line 120 to provide a shift clock enable signal to a second input of the AND gate 102. The output of gate 102 provides a clock signal for the shift registers 99.

The data from the registers 99 is transmitted through a line 104 to the output data formatter circuit 105. The circuit 105 produces an output signal at a line 106, an output-enable signal at a line 107, a verify-enable signal at a line 108 and receives an overcurrent-flag signal at a line 109.

D/A converter 100 produces an output voltage control signal at a line 110. The output voltage control signal is provided to an adjustable voltage regulator 111 and the output of the regulator 111 is provided through a line 112 to a line driver 113. The voltage control signal at line 110 controls the output voltage of the regulator 111.

The verify-enable signal at line 108 is provided to a line pull-up circuit 114. The output of circuit 114 is provided to one of the wires of the two-wire line 18.

A battery (not shown) is provided for powering the control unit 12 and this power is provided through a line 115 to, among others, voltage regulator 111 and line pull-up circuit 114.

The output-enable signal at line 107 is input to a slew-rate limit amplifier 116, the output of which is provided to the line driver 113.

The output signal at line 106 is input to slew-rate limiting amplifier 117, the output of which is provided to the line driver 113.

The current amplitude transmitted through the lines 18 by the line driver 113 is monitored through lines 118 and 121 which are connected to the input of an overcurrent detect circuit 122. The overcurrent-flag signal at line 109 is produced by the overcurrent detect circuit 122.

Operation of the communication circuit 34 is now briefly described in reference to FIGS. 1, 2a and 2b. The two-wire line 18 provides bi-directional communication between the control unit 12 and the detonator delay circuits, such as 14, 16 and others. The generation of commands from addresses and data is carried by the microprocessor 24. The commands are converted into control signals by the command decoder 98 which drives the various circuits within the communication circuit 34. The data to be transmitted to the detonator circuits is transmitted through the data bus 96 and stored in the registers 99. The data is then transferred into the circuit 105 together with control information from the master state machine circuit 103. The output data from circuit 105 is transmitted as a serial output signal through the line 106 to the amplifier 117 and then to the line driver 113. The line driver 113 transmits the output serial signal as a differential signal through the two-wires of line 18.

The microprocessor 24 likewise generates control signals for producing the output-enable signal at line 107 and the verify-enable signal at line 108. The output-enable signal is transmitted through the slew-rate limiting amplifier 116 and then to the line driver 113.

Microprocessor 24 likewise controls the operation of the D/A converter 100 to produce an output voltage control that drives the adjustable voltage regulator 111. This voltage regulator supplies a desired voltage through the line 112 to the line driver 113. This operation provides the communication voltage and the arming voltage that are applied between the wires of line 18.

The master state machine circuit is a combination logic circuit that operates in response to the clock signal through line 78 as well as to various ones of the output controls produced by the command decoder 98. One of the outputs of the circuit 103 is a shift-clock enable signal which is transmitted through line 120 to the AND gate 102. The output of the AND gate 102 in synchronism with the clock signal on line 78, provides the shift signal to shift data through the command/data shift registers 99.

Further referring to FIGS. 2a and 2b, a band-pass filter 132 has the input connected to each of the wires in the line 18. The output of filter 132 is provided to a detection amplifier 134 which, in turn, produces a receive signal at a line 136. In embodiment A of the present invention, the receive signal at line 136 is input to a latch 138. The output from the latch 138 is transmitted through a line 140 to provide a verify pulse to the status registers 101. In a second embodiment of the present invention, embodiment B, the receive signal at line 136 is input to a Manchester decoder 142 for decoding data transmitted by one of the delay circuits, such as 14 and 16. This data is provided to shift registers 123 for transfer into the bus 96 for delivery to the microprocessor 24.

The digital-to-analog converter 100 produces the output voltage control at line 110 which determines the voltage at the line 112 produced by the adjustable voltage regulator 111. For carrying out communications between the control unit 12 and a delay circuit, such as 14, a preselected voltage is needed at the lines 18 for transferring data to the delay circuits. This is the communication voltage level. This voltage must take into account the line losses incurred in the lines 18. It may be necessary, for long lines, to apply 24 volts to the two-wire line 18 to ensure that 10 volts is received at the delay circuit 14. When the preparation for the blasting operation has progressed beyond the set-up and calibration described below, it is necessary to charge the energy storage circuits 56 to a high energy level to ensure ignition of the fuse 68. This is done by a command transmitted from the microprocessor 24 to the digital-to-analog converter 100 for producing an output control voltage at line 110 that drives the adjustable voltage regulator 111 to produce a higher, arming voltage, which is provided through line 112 to the line driver 113. This high voltage, likewise, must be made sufficiently high to accommodate line losses through the two-wire line 18.

When the voltage regulator 111 is providing a communication level signal through the line 112 to the line drivers 113, the output signal at 106 is provided to modulate the line driver 113 for providing the output signal to the two-wire line 18. However, the line driver 113 does not provide any communication signal to the line 18 until an output-enable signal at line 107 has been received. Thus, the output enable signal must be properly set before there can be any communication from the control unit 12 to the delay circuits, such as, 14 and 16.

Certain communications, as described below, must be carried out by transferring information from the delay circuits, such as 14 and 16, back to the control unit 12. In this communication mode, the line driver 113 is disabled by the output-enable signal at 107. When line driver 113 is disabled, it presents a high impedance to the line 18. A verify-enable signal at line 108 is applied to the line pull-up circuit 114 to establish this communication mode. The circuit 114 provides a communication voltage level to the two-wire line 18, but includes a relatively high impedance so that small current modulations caused by the delay circuits, such as 14 and 16, can be detected. The delay circuits, 14 and 16, transmit information back to the control unit 12 by impedance modulating the load on the two-wire line 18.

When a detonator circuit, such as circuits 14, 16, transmits data to the control unit 12, the circuits do so by modifying the impedance between the wires of the line 18. The signal produced by such impedance modification is passed through the band pass filter 132 to reduce noise and is then supplied to a detection amplifier 134. The amplitude modulated data comprises the receive signal transmitted through line 136. For embodiment A, the receive signal, a digital signal, is input to the latch 138. In this embodiment, the receive signal comprises only a verify pulse. This verify pulse is then stored in the registers 101 and returned to the microprocessor 24 in response to a command which was transmitted by the control unit 12.

In embodiment B of the present invention, the receive signal at line 136 is input to the Manchester decoder 142, a conventional circuit, for producing a digital data string that is input to the shift registers 123. This digital data string comprises information generated by one of the detonator circuits, as further described below. This digital data is transferred via the shift registers 123 and the bus 96 back to the microprocessor 24.

The communication circuit, such as circuit 48, used in the delay circuit 14 is illustrated in FIG. 3. As noted in FIG. 1, the communication circuit 48 is connected to the two-wire line 18. In FIG. 3 line 18 is connected to nodes 124 and 125. A full wave bridge rectifier comprising diodes 126, 127, 128 and 129 is connected between nodes 124 and 125. The output nodes of the bridge rectifier are connected to the lines 53 and 55, respectively. The output of the bridge rectifier at lines 53 and 55 is input to a comparator 146. This comparator 146 is provided with hysteresis. The output of the comparator 146 is output through a line 148 to a Manchester decoder circuit 150. The decoded information from the decoder 150 together with a corresponding clock signal is transmitted through lines 152 and 154 to an error detector/corrector circuit 156. The output of the circuit 156 is transmitted through line 50 to the circuit 42.

As an option to the Manchester decoder 150, there may be used a circuit based on a universal asynchronous receiver transmitter (UART) such as a model 68681 made by Motorola.

The lines 53 and 55 are still further connected to the source and drain terminals of a field effect transistor 158 which has the gate terminal thereof connected to receive data signals from the circuit 42 through the line 50 for modulating the input impedance of the delay circuit14 for transmission of data from the delay circuit through line 18 back to the control unit 12. Current variations on the line 18 are detected by the communication circuit 34 in the control unit 12.

Figure 4A:
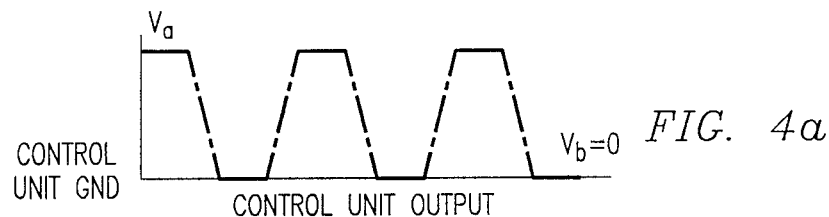
FIGS. 4a–4c are a group of waveforms illustrating communication between the control unit and a delay circuit.
Figure 4B:
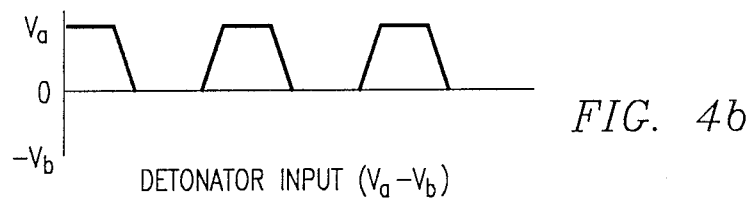
Figure 4C:
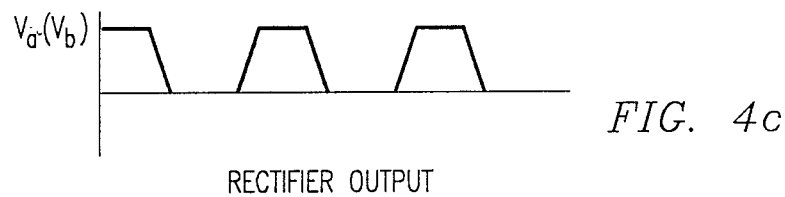

Control signals that are transmitted between the control unit 12 and the delay circuit 14 are illustrated in FIGS. 4a, 4b and 4c. The control unit output is represented by voltage levels $V_a$ and $V_b$ shown in FIG. 4a which are the differential voltages on output line 18. The signal that is input differentially to the delay circuit 14 between nodes 124 and 125 is illustrated in FIG. 4b. The output of the bridge rectifier at nodes 53 and 55 is illustrated in FIG. 4c.

Figure 5:
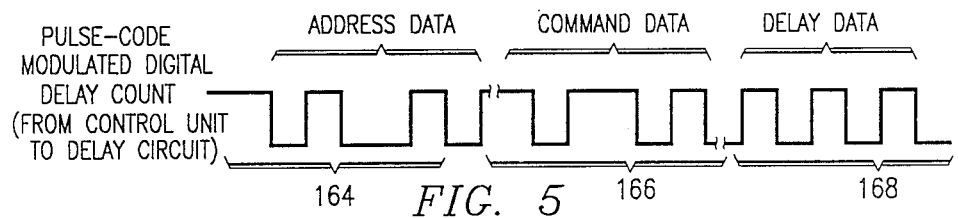
FIG. 5 is a waveform illustrating pulse code modulation for transferring information between the control unit and the detonator delay circuits.

Voltages Va and Vb are modulated by the control unit 12 formatter circuit 105 such that the data signal comprises pulse code modulated data as shown in FIG. 5.

The waveform in FIG. 5 illustrates the digital transmission of information between the control unit 12 and the delay circuits, such as circuit 14. The preferred communication method for the present invention is pulse-code modulation. Each of the delay circuits is assigned an address which is stored in the address storage 43 prior to installation of the delay circuit at its location of use. The control unit 12 transfers a digital delay count to each of the delay circuits by sending the address of the particular delay circuit followed by a command telling the delay circuit to store a delay count and this is followed by a count which represents a delay time.

If the local oscillator 76 were highly accurate, the delay count provided to the delay circuit would be the number of pulses which would be produced by the local oscillator between the initiation of the delay sequence and the ignition of the fuse 68 by the delay circuit 14. However, it is recognized that it is very difficult to have a local oscillator, such as 76, which has the necessary precision to meet the accuracy requirements for a delay detonator circuit. In a preferred embodiment, an accuracy of $+/-10$ microseconds over a total delay time of 1 second is desired. This corresponds to an accuracy of 10 parts per million (ppm). The same accuracy figure is therefore required for the local oscillator in order to achieve the desired goal. Because of manufacturing tolerances, this is very difficult to meet without correction of either the oscillator rate or the delay count.

Further referring to FIG. 5, there is shown an address data portion, a command data portion and a delay data count. The address portion is represented by section 164, the command data is represented by section 166 and the delay count of the pulse code data is represented by section 168.

Figure 6A:
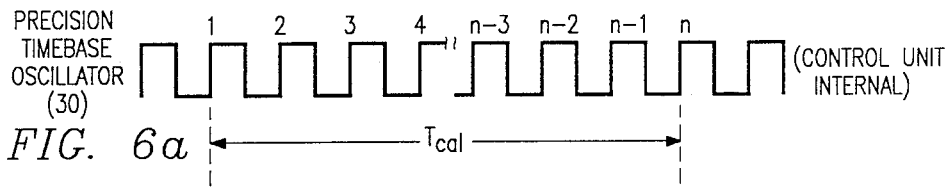
FIGS. 6a, 6b and 6c are a group of waveforms illustrating the relationship of signals produced by a local oscillator in a delay circuit, a precision oscillator in a control unit and a calibration pulse which is transmitted from the control unit to each of the delay circuits.
Figure 6B:
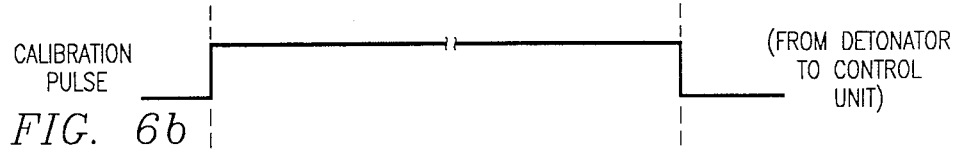
Figure 6C:
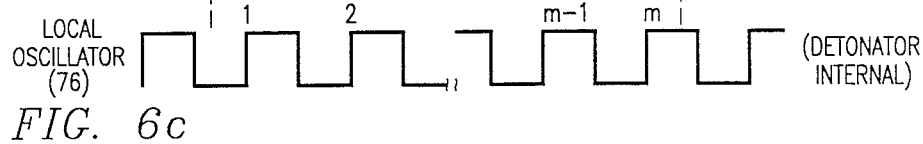

FIGS. 6a–6c are illustrations of the timing signals used in conjunction with the calibration processes of the present invention. FIG. 6a represents the output of the precision oscillator 30 which is located in the control unit 12. FIG. 6b is a calibration pulse determined by the precision oscillator in the control unit 12. FIG. 6c represents the clock output of the local oscillator 76 in a delay circuit.

Operation of the present invention is now described in reference to the figures. Two methods of operation for the present invention are described. These are termed embodiments A and B. In both methods a calibration pulse is transmitted from the control unit 12 concurrently to each of the delay circuits. The precision time base oscillator at the control unit produces an accurate train of clock pulses (see FIG. 6a). The control unit 12 counts a fixed number of these pulses to define a calibration pulse as shown in FIG. 6b. The calibration pulse is transmitted via the two-wire lines, such as 18 and 20, concurrently to each of the delay circuits, such as 14. The calibration pulse is preceded by a universal address and a command instructing all delay circuits to calibrate their time bases. (See address data 164 and command data 166 in FIG. 5.) Upon receipt of the leading edge of the calibration pulse, see FIG. 6b, each of the delay circuits begins to count the output of its local oscillator, as shown in FIG. 6c, in a counter such as 82. Upon receipt of the trailing edge of the calibration pulse, each delay circuit terminates the count from its local oscillator in the counter 82. Each delay circuit then has stored therein a count from its local oscillator. This count is the number of pulses produced from the local oscillator during the precision calibration pulse. Due to manufacturing and environmental variations, the delay circuits will most likely have different counts stored as a result of the calibration pulse.

In embodiment A, either prior to the transmission of the calibration pulse or afterwards, the control unit 12 transmits an individual delay count to each of the delay circuits. This delay count represents a time interval for the activation of the delay ignition circuit following receipt of a detonate command from the control unit. Thus, each delay circuit has stored therein a delay count received from the control unit 12. Each circuit further has stored therein a count which is the ideal count that should have been received from the local oscillator, if the rate of the local oscillator had been precise. This ideal count can be built into the circuit at the time of manufacture or programmed at a later time. The count from the local oscillator is divided by the predetermined precision count to produce a correction factor for the rate of the local oscillator. This correction factor is then applied to the delay count, which has previously been received from the control unit, to produce a corrected delay count for use by the delay circuit. Electronic circuitry for producing the correction factor is described in reference to FIG. 7.

Upon receipt of a detonate command from the control unit 12, the delay circuit counts the output of the local oscillator in counter 82 until this count compares to the corrected delay count, which was produced earlier by the delay circuit. This comparison is done in the register comparator 88, shown in FIG. 1. Upon reaching the corrected delay count, the delay circuit transfers stored energy from the circuit 56 through the switch 62 into the fuse 68 to cause activation of the fuse and thereby ignition of proximately located explosives. Each delay circuit can have a different delay period.

By use of this technique, embodiment A, the delay inaccuracy which would result because of delay circuit time base error, can be corrected by calibration. By transmitting the delay counts prior to the calibration pulse, the time period between the calibration pulse and the actual ignition of the delay ignition circuit can be made very short and thereby reduce the effect of short term drift for the local oscillators 76 within the delay circuits. This has the further advantage of simultaneously calibrating all detonators, thereby reducing the time between calibration and detonation.

A further embodiment of the present invention, embodiment B, likewise utilizes the calibration pulse described above. In a similar fashion each delay circuit counts the output of its local oscillator during the calibration pulse and produces a local oscillator count. In embodiment B of the present invention, the local count is transmitted back through the two pair line 18 to the control unit 12 upon receipt of a request to do so from the control unit 12. The control unit then compares this local count to the ideal count that should have been produced during the calibration time period and through a series of calculations produces a correction factor. The control unit then applies the correction factor to the desired delay count for the individual delay circuits. This corrected delay count is then transmitted, by use of an address, to the individual delay circuits where the count is then stored in the delay circuit. Upon receipt of the detonate command, the delay circuit counts the output of its local oscillator until it compares to the received, corrected delay count and, upon a comparison, causes initiation of its fuse, which in turn ignites the associated explosive.

The second described technique, embodiment B, has the advantage that less calculation is required at the delay circuit and the delay circuit is therefore less complex and less expensive. But embodiment B requires more communication, and therefore, additional time is required to perform the calibration of an entire collection of delay circuits, the number of which circuits may be in the hundreds. Thus, there is time for more drift by the local oscillators. However, the communication should be completed in such a short time that drift by the local oscillators is not significant. The additional communication is particularly fast because, after the calibration pulse is transmitted, the actual communication between the control unit 12 and the delay circuits is only the transmission of numbers, rather than the transmission of any time intervals themselves.

Referring now to FIG. 7, there is shown a particular implementation for internal scaling circuitry included in a delay circuit 14 for use with the embodiment A calibration technique. This circuitry would be in the time base correction logic circuit 44. A logic circuit 174 includes an original delay count register 176 which has an ideal delay count that was previously received and stored therein. A calibration pulse counter 178 receives the output produced by the local oscillator 76 during the calibration time period. The local oscillator pulses are gated by the calibration pulse.

The original delay count $C_0$ is transmitted through a data path 180 to a first input of a multiplier 182 and to the first input of an adder 184. The output of the counter 178 is provided to the positive input of a substraction circuit 186.

An ideal calibration pulse count register 188 has stored therein a count that would ideally be produced by the local oscillator if it were perfectly calibrated. This is termed $C_i = 2^4$. The output from the register 188 is transmitted to the negative input of the circuit 186. Preferably, the outputs of the counter 178 and the register 188 are four bits in duration, however, other bit group counts can also be used. The difference produced by the circuit 186 has an output that has a size of Z bits.

This is provided to the second input of multiplier 182. The product produced by multiplier 182 has a length of X plus Z bits. This product is transmitted to the input of a shift/truncate circuit 190 which produces an output having a length of Z bits. The output from the circuit 190 is provided to a further input of the adder 184. The difference produced by adder 184 is provided to a scaled delay count register 192. This register then contains the corrected delay count which serves as the basis of comparison to the output of the local oscillator for determining the delay ignition time period.

The embodiment illustrated in FIG. 7 represents a technique for performing the various mathematical calculations wherein the number of necessary gates in a calculation circuit can be minimized.

The following detailed description for the operation of the control unit 12 and the delay circuits, such as 14 and 16, is made in reference to a blast set up. In a typical blasting operation, holes are dug in a pattern over a given area of terrain. Explosive material is placed in the holes and a delay ignition circuit is also placed in each hole proximate the explosive material. Each of the delay circuits is connected through a pair of wires to the control unit 12. An operator maintains a map of the blasting site with a particular identification address for each detonation delay circuit. Each of the identified circuits has a predetermined address so that data and commands can be transferred from the control unit 12 individually to each of the delay circuits. The operator determines the time delays necessary for the particular blasting operation by a review of local conditions and requirements. These delays are programmed into the system as described below.

Figure 8:
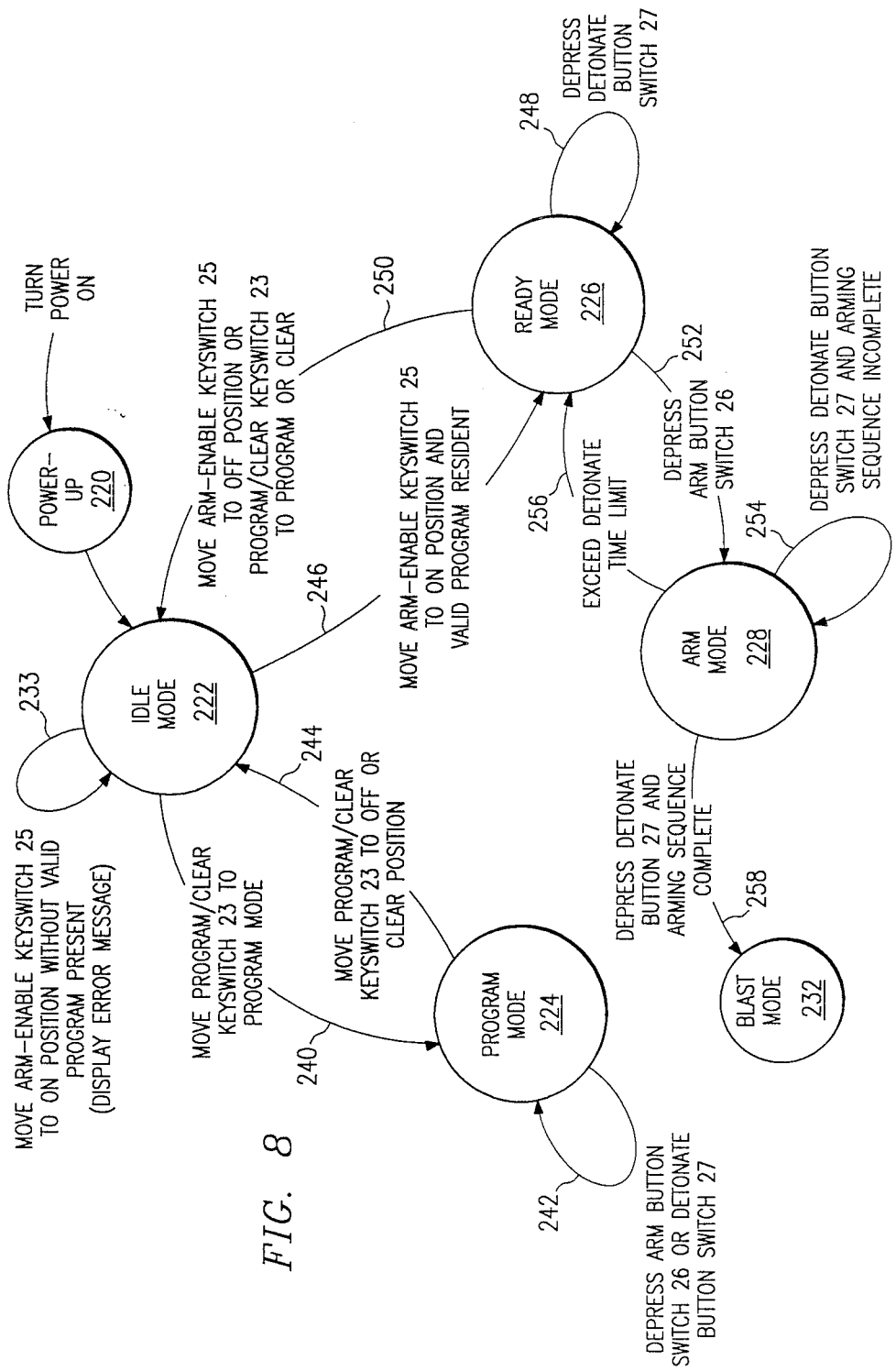
FIG. 8 is a master functional diagram illustrating the operation of the control unit of the present invention.

Referring now to FIG. 8 there is illustrated the overall functional operation of the control unit 12. Operation of the control unit 12 is initiated with a power-up mode 220. This mode is entered when power is applied to the control unit 12. The power-up mode 220 is further described in reference to FIG. 9. After completion of the operations in the power-up mode 220, the operation of the control unit 12 enters an idle mode 222. The idle mode 222 for the control unit 12 is an inactive state wherein the control unit awaiting commands to begin operation.

If the operator should move the arm-enable key switch 25 to the on position without a valid program resident in the control unit 12, there will be a transition through a path 233 back to the idle mode 222. Concurrently, an error message will be displayed at the display 21 indicating the improper operator action that has occurred.

In a typical operation, the operator will initially enter a program mode 224 for programming the selected delays into the delay circuits. After the program mode 224 is completed, the operator returns to the idle mode 222. The operator then transitions to a ready mode 226 and subsequently to an arm mode 228. Finally, the operator enters a blast mode 232 in which a detonation command is transmitted from the control unit 12 to the delay circuits for igniting the primary explosives.

Program mode 224, ready mode 226, arm mode 228 and blast mode 232 are further described in detail below. Further referring to FIG. 8, upon entry into the idle mode 222, an operator may follow a path 240 by moving the program/clear keyswitch 23 to the program mode. The keyswitch 23 is shown in FIG. 1. The path 240 produces a transition to the program mode 224. The detailed operations carried out in the program mode 224 are described in reference to FIG. 10. Should the operator depress arm button 26 or detonate button 27, the program will enter a path 242 which performs no function but returns to the program mode 224. Thus, while the operator is in program mode 224, the arm button switch 26 and detonate button switch 27 are inactive. Upon completion of the program operations in mode 224, the operator moves the program/clear key switch 23 to the off or clear position and transitions through a path 244 back to the idle mode 222.

After the programming of the delay circuits has been completed, the operator can exit the idle mode 222 and transition along a path 246 to the ready mode 226 by moving the arm enable keyswitch 25 to the on position, provided that there is a valid program resident in the control unit 12. The operations carried out in the ready mode 226 are further described in detail in reference to FIG. 11. Should the operator depress the detonate button switch 27 while in the ready mode 226, there will be a transition through path 248 to return to the ready mode 226. Thus, the detonate button switch 27 is inactivated during the ready mode 226. After completion of the operations in the ready mode 226, the operator may optionally transition through a path 250 to return to the idle mode 222 by moving the arm-enable keyswitch 25 to the off position or by setting the program/clear key switch 23 to the program or clear position. However, if the operator desires to continue with the procedure leading to the ignition of the explosives, the operator transitions through a path 252 to the arm mode 228. The transition through path 252 is accomplished when the operator depresses the arm button switch 26.

Figure 12:
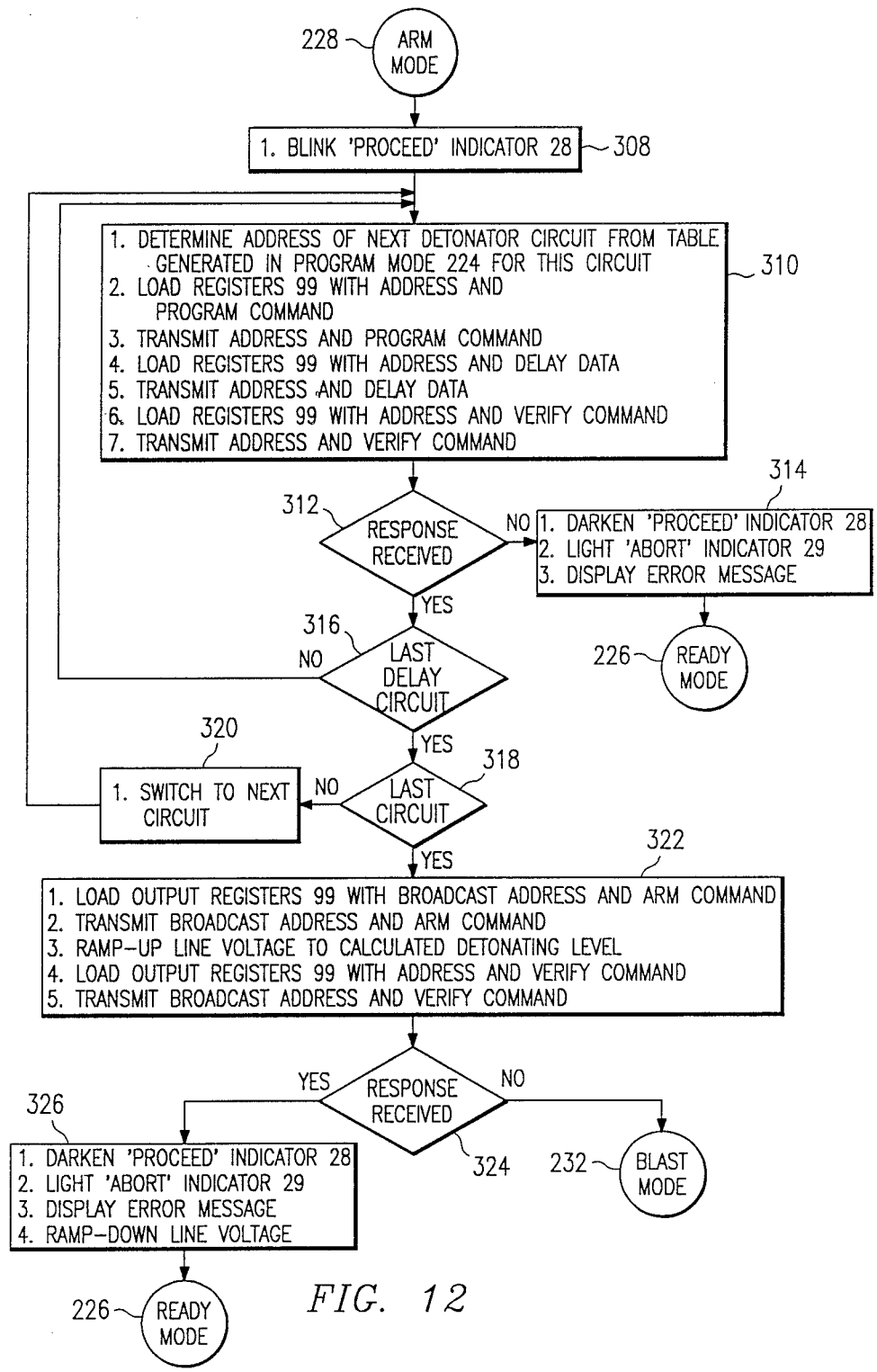
FIG. 12 is a flow diagram which describes the arm mode operation of the control unit.

The operations carried out in the arm mode 228 are further described in reference to FIG. 12. If the operator depresses the detonate button switch 27 and the arming sequence is incomplete, the operation in the control unit 12 transitions through a path 254 back to the arm mode 228. Thus, the detonate button switch 27 is inactive until the arming sequence is complete. Should a predetermined detonate time limit be exceeded while in the arm mode 228, the program transitions from the arm mode 228 through a path 256 back to the ready mode 226. If the operator wishes to continue in the sequence of operations leading to ignition of the explosives, the operator depresses the detonate button 27 and proceeds along path 258 to the blast mode 232, original provided that the arming sequence has been completed. The operations carried out in the blast mode 232 are further described in detail in reference to FIGS. 13 and 14a–14b.

Figure 9:
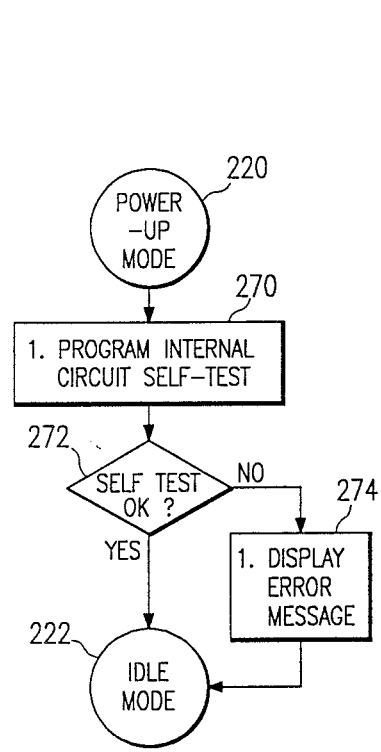
FIG. 9 is a flow diagram for the power-up mode of operation for the control unit.

Referring now to FIG. 9, there are illustrated the operations carried out in the power-up mode 220. The first step in the power-up mode is carried out in operational block 270. This comprises the operation of performing an internal circuit self test, a conventional procedure, for the control unit 12. Following block 270 the program enters a question block 272 which evaluates the result of the internal circuit self-test. If the self test was successful, the YES exit is taken to the idle mode 222. If the self test was not successful, the NO exit is taken to an operation block 274. In block 247 there is carried out the operation of displaying an error message at the display 21 indicating that the internal self test was not successful. Subsequent to block 274 the program returns to the idle mode 222.

Figure 10:
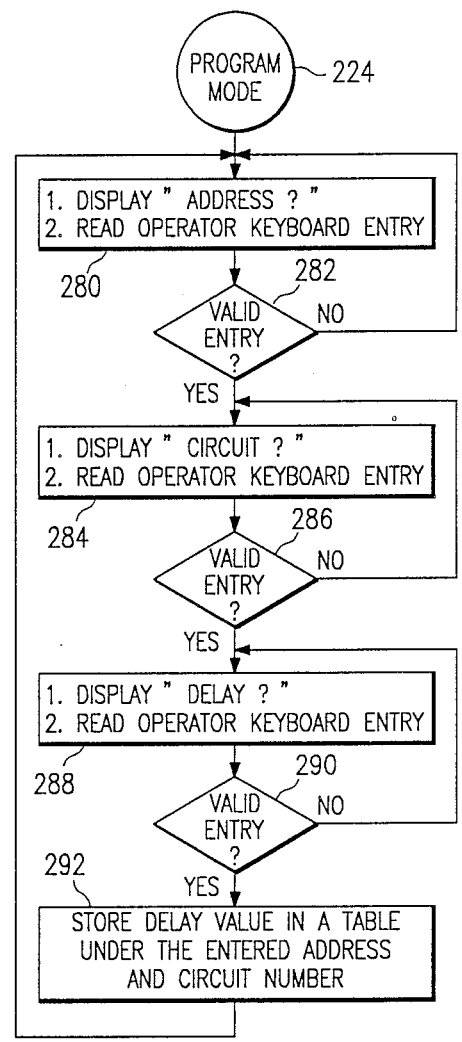
FIG. 10 is a flow diagram which describes the program mode operation for the control unit.

The programming of the delay circuits is described in reference to FIG. 10 for the program mode 224. The object of the programming is to establish a table in the control unit 12 that defines the delay time for each of the delay circuits. The first step in the program mode 224 is an operation block 280. In this block, the control unit 12 produces at the display 21 the term "address?". The control unit 12 then monitors the operator's entry at the keyboard 22 for receiving the address for the selected delay circuit. The operator typically works from a map of the blasting site. The map has a delay time and address for each of the delay circuits at the location for the explosives. Next, the program enters a question block 282 for determining if the operator has made a valid entry. A valid entry is one that is within a predetermined range of acceptable addresses. If the entry is not within this acceptable range, it is invalid. If the entry is not valid, the program returns to the operation block 280. If the entry is valid the program proceeds to an operation block 284.

In the block 284, the control circuit 12 produces at the display 21 the term "circuit?". The operator is then responsible for entering the appropriate circuit number. Note in reference to FIG. 1 that the line pairs 18 and 20 are for respective circuits No. 1 and No. N. Thus, the particular address may be the same for different delay ignition circuits that are on different communication circuits. In the next step of the operation carried out with reference to block 284, the control unit 12 receives the operator entry for circuit number from the keyboard 22.

Subsequent to operation block 284, the program for the control unit 12 enters a question block 286 to determine if the entry made by the operator is valid. If the entry is not valid, the program returns to the operation block 284. If the entry is valid, the program proceeds to operation block 288.

Within the block 288, the control unit 12 produces at the display 21 the term "DELAY?". In response, the control unit 12 receives the operator keyboard entry. Next, the program enters a question block 290 to determine if the operator has entered valid data. If the data is not valid, that is, the entered delay is not within an acceptable range, the program returns to enter the operation block 288. If the entry is valid, the program proceeds to operation block 292.

Within block 292 the control unit 12 stores the delay value received from the operator in a table under the entered address and circuit number. Next, the program returns to operation block 280 for receipt of the next sequence of information for another delay circuit.

Figure 11:
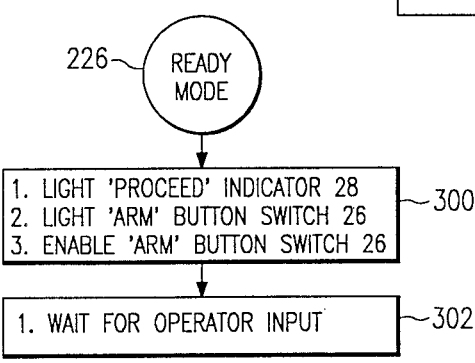
FIG. 11 is a flow diagram which describes the ready mode operation for the control unit.

Referring now to FIG. 11, there is described the ready mode 226. Upon entry to mode 226, an operation block 300 is executed. The first steps in the block 300 are to light the proceed indicator 28 and the arm button switch 26 lamp. The next step is to enable the arm button switch 26 lamp. After completion of the steps in operation block 300, the programming control unit 12 proceeds into an operation block 302 to wait for operator input.

The arm mode 228 is now described in detail in reference to FIG. 12. This description is for embodiment A. In a first operation block 308, the control unit 12 causes the proceed indicator 28 to blink. This indicates that the control unit is actually running through the arming sequence. Next, the control unit 12 enters an operation block 310. The first step in this block is to determine the address of the next detonator delay circuit from the table generated in the program mode for the circuit now being programmed. Next, the control unit 12 loads the registers 99 with an address and program command for the delay circuit being programmed. The address and program commands are then transmitted through the two line wire 18 to the appropriate delay circuit. The registers 99 are loaded with address and delay data. This address and delay data is then transmitted through the communication lines, such as 18. Finally, the registers 99 are loaded with an address and a positive verify command for the delay circuit being programmed. This address and positive verify command are then transmitted to the delay circuit. Following block 310, the control unit 12 proceeds to a question block 312.

In the question block 312, the control unit 12 determines if a response has been received from the addressed delay circuit. If no response is received, the control unit 12 takes the NO exit to operation block 314. Within the block 314, the abort indicator 29 is lighted. Further, an error message is produced at the display 21 indicating that a problem has occurred and the nature of the problem. If delay circuit operation is proper, a verify response should be reviewed by the control unit for a positive verify command. After the operations in block 314 have been completed, the program transitions to the ready mode 226.

If a response is received for block 312, the program for control unit 12 transitions from the question block 312 through the YES exit to a question block 316. If the last detonator delay circuit has been programmed, the control unit 12 transitions through the YES exit to a question block 318. If this programming step is not for the last delay circuit, the NO exit is taken to an operation block 320. Within block 320, the circuit number is incremented by one unit and the program is returned to operation block 310. Returning to the question block 316, if the last detonator delay circuit has not been programmed, then the NO exit is taken to likewise return the control unit 12 program to the operation block 310 for programming the next delay circuit.

Returning to question block 318, if the last circuit has been programmed, the YES exit is taken to an operation block 322. Within the block 322, the control unit 12 carries out various functions. The output registers 99 are loaded with a broadcast address and an arm command directed to all delay circuits. The broadcast address and arm command are then transmitted to all of the delay circuits. Next, a ramp-up line voltage is applied to the two wire line, such as 18, by operation of the adjustable voltage regulator 111 and the line driver 113. The voltage on the line 18 is elevated to a predetermined detonating level. This assures that there is sufficient energy stored in the energy storage circuits, such as 56, in each of the delay circuits. Next, the output registers 99 are loaded with an address and a negative verify command is directed to all of the delay circuits. The broadcast address and negative verify command are then transmitted concurrently to the delay circuits. In the design of the present system, each of the delay circuits carries out an internal verify operation to determine that its operation is proper and that a full voltage is stored on the energy storage circuit 56. If these conditions are not met, an error condition response is transmitted from the delay circuit back to the control unit 12. This can be a single pulse. If no response is received from any of the delay circuits, then each has properly verified its operation. If any response is received to the negative verify command, the arm mode is aborted, as shown for block 314.

Following the operation block 322, the control unit 12 program enters a question block 324. If a response has not been received, as discussed above, the control unit 12 transitions to the blast mode 232. If a response is received, the control unit 12 transitions to an operation block 326. Within the block 326, the control unit 12 darkens the proceed indicator 28, lights the ABORT indicator 29, produces an error message at the display 21 indicating the nature of the problem and performs a ramp-down for the line voltage at the line pair 18 by voltage regulator 111 and line driver 113. Reduction in the line voltage serves to slowly discharge the energy storage circuits 56 at each of the delay circuits and thereby deactivate these circuits to prevent the ignition of any of the corresponding fuses, such as 68. After completion of the steps set forth in the operation block 326, the program transitions to the ready mode 226.

The arm mode 228 for embodiment B of the present invention comprises the flow diagram shown in FIG. 12 but with the deletion of steps 2, 3, 4 and 5 from block 310.

The blast mode 232 in accordance with the present invention can be carried out in two ways. These are illustrated as embodiment A in FIG. 13 and embodiment B in FIGS. 14a and 14b. Referring now to FIG. 13, the blast mode 232 starts with an operation block 332. Within block 332, the control unit 12 extinguishes the light associated with the arm button switch 26, disables the arm button switch 26, lights the proceed indicator 28, lights the lamp for the detonate button switch 27 and enables the detonate button switch 27. Following these operations, the control unit 12 exits the block 332 and enters a question block 334.

Whenever the blast mode 232 is entered, a timer is started to limit the duration of time that can be expended while in this mode. This is a safety mechanism. If the time limit has been exceeded, the program returns to the arm mode 228. If the time limit has not been exceeded, the control unit 12 program transitions through the NO exit to a question block 336. It is at this block that the control unit 12 awaits the action of the operator in depressing the detonate button switch 27. If the button has not been pressed, the control unit 12 transitions through the NO exit to the input of the question block 334. If the detonate button switch 27 has been depressed, the control unit 12 transitions through the YES exit to an operation block 338.

A number of operations are carried out within the block 338. The output registers 99 are loaded with a broadcast address and a calibrate command. All of the delay circuits respond to a broadcast address. The broadcast address and calibrate command are then transmitted to all of the delay circuits. Next, a precision calibration pulse is transmitted from the control unit 12 through the line 18 and any other circuits, such as line 20, to all of the delay circuits within the system. Next, the output registers 99 are loaded with the broadcast address and a detonate command. The broadcast address and detonate command are then transmitted to all of the delay circuits to initiate the detonation sequence within each of the delay circuits. Next, the control unit 12 turns off the detonate button light of switch 27 and turns off the proceed indicator 28. At this point the individual delay circuits delay for the predetermined time period previously sent to the delay circuits. After the delay, energy is transferred from the storage circuit 56 through the switch 62 to the fuse 68 within each of the delay circuits, as further described below. This in turn ignites the proximate explosives. The control unit 12 then returns to the ready mode 226.

Figure 14B:
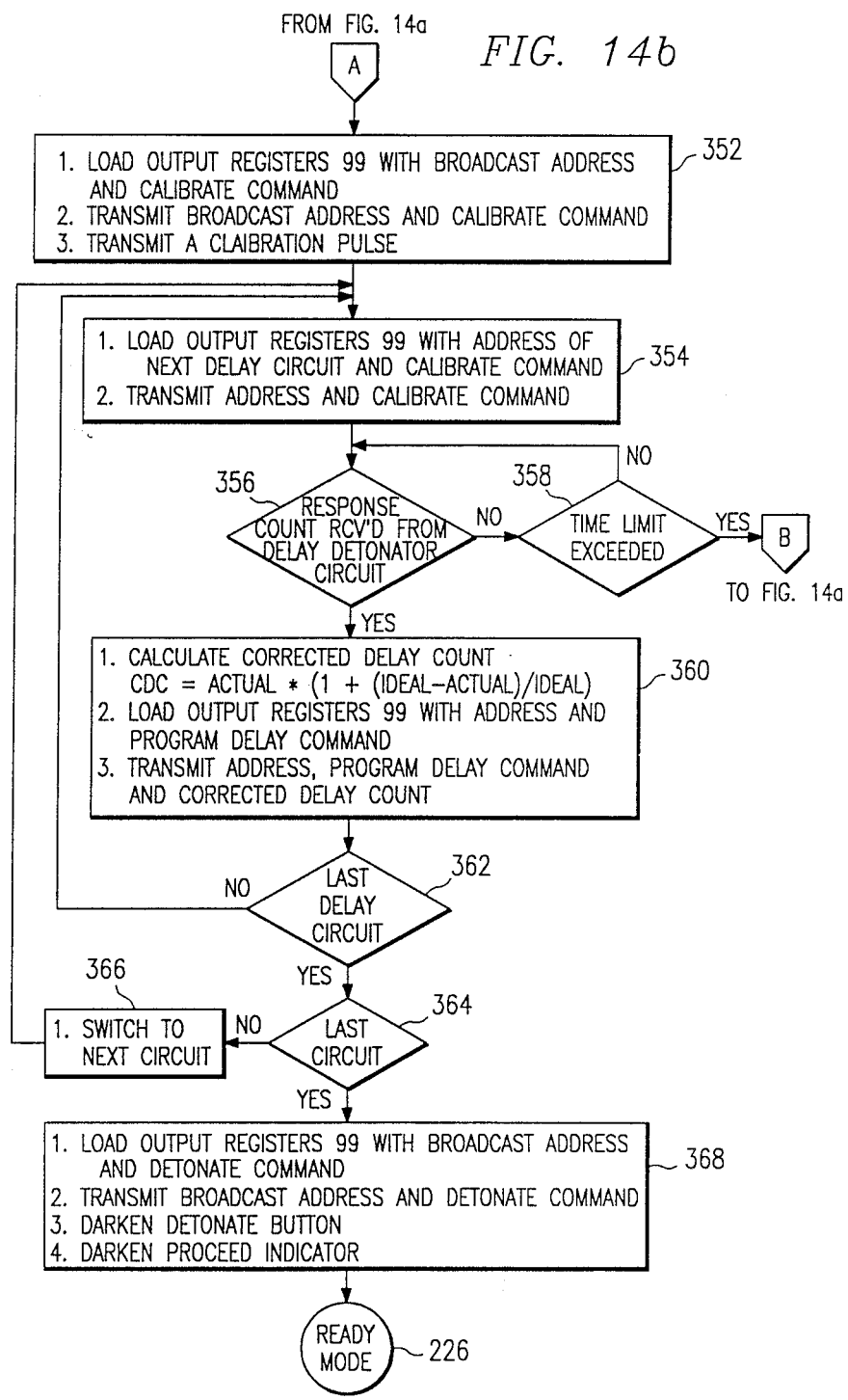

The embodiment B operation for the blast mode 232 is now described in reference to FIGS. 14a and 14b. Upon entry into the blast mode 232 for this embodiment, the control unit 12 enters an operation block 346. Within the block 346, the following operations are carried out. The arm button switch 26 lamp is darkened, the arm-button switch 26 is disabled, the proceed indicator 28 is lighted, the detonate button switch 27 lamp is lighted and the detonate button switch 27 is enabled.

Following the operation block 346 the control unit 12 operation enters a question block 348. As with the description of the blast mode 232 above, there is a time limit established.

If the time limit is exceeded, the control unit 12 takes the YES exit to an operation block 349. Within the block 349, the control unit 12 produces an error message at the display 21. If the time limit has not been exceeded, the program takes the NO exit and enters a question block 350. This block detects whether the detonate button switch 27 has been depressed. If it has not been depressed, the program returns to the question block 348. If the detonate button switch 27 has been depressed, the program transitions to an operation block 352 (FIG. 14b). Within the block 352, the control unit 12 loads the output registers 99 with a broadcast address and a calibrate command. Next, the broadcast address and calibrate command are transmitted concurrently to all of the delay detonator circuits. Finally, a precision calibration pulse is transmitted concurrently to each of the delay detonator circuits. Upon completion of the calibration pulse, the program enters an operation block 354. Within the block 354, the output registers 99 are loaded with an address for the next delay detonator circuit together with a calibrate command. This calibrate command requests that the delay circuit respond with the count it made for the output of its local oscillator during the calibration pulse. Next, the address for the individual delay circuit together the calibrate command are transmitted through the two-wire line 18 for circuit 1.

Following the operation block 354, the control unit 12 transitions to a question block 356. Within this block the control unit 12 awaits a response count to be received from the addressed detonator delay circuit. If a response is not received the program transitions through the NO exit to a question block 358. A time limit is set after the address for a particular delay detonator circuit is sent. If this time limit is not exceeded, the program returns to the question block 356 to further await a response from the addressed detonator delay circuit. If the time limit for receiving a response has been exceeded, the program transitions through the YES exit and returns to the arm mode 228 after producing an error message in block 349.

As described above, each of the delay circuits counts the output from its local oscillator during the calibration time period. This count is returned to the control unit 12 as the response count. When the response count has been received, the program transitions through the YES output of the question block 356 to an operation block 360.

Within the operation block 360, the control unit 12 calculates a corrected delay count for the addressed delay detonator circuit. The corrected delay count is the product of the actual delay count with the quantity comprising 1 plus the ratio of the ideal minus the actual count and the ideal count. Next, the output registers 99 are loaded with an address and program delay command for the previously addressed detonator delay circuit. The program delay command is the corrected delay count. The address for the particular delay detonator circuit together with the program delay command are then transmitted to the addressed delay circuit.

Upon completion of the operation for block 360, a question block 362 is entered to determine if the last detonator delay circuit has been calibrated. If not, the NO exit is taken to return the program to the operation block 354 to repeat the process of calibrating the next detonator delay circuit. If the last detonator has been calibrated, the YES exit is taken to a question block 364. Within the block 364, an inquiry is made to determine if the last circuit has been calibrated. This is for the circuit No. N corresponding to the two-wire line 20, shown in FIG. 1. If the last circuit has not been calibrated, the NO exit is taken to an operation block 366. Within the block 366, a switch is made to the next circuit for calibration. From the block 366 a transition is made to the block 354 for calibrating the next series of detonator delay circuits. If the last circuit has been calibrated, the YES exit is taken from the question block 364 to an operation block 368.

Within the block 368 the control unit 12 loads the output registers 99 with a broadcast address together with the detonate command. This address and command are directed to all of the delay detonator circuits. The broadcast address and detonate command are transmitted concurrently to each of the detonator delay circuits. Next, the detonate button switch 27 lamp is darkened and the proceed indicator 28 is likewise darkened (extinguished).

The above flow diagrams have described the operation of the control unit 12 for the various operations including programming, calibration and detonation. The flow diagrams for the operation of the delay detonator circuits, such as 14, are shown in FIGS. 15a-d, 16, 17 and 18. The functional operations described above for the operation of the control unit 12 can be carried out by conventional programming of the microprocessor 24 and conventional logic design of the circuit 103. Likewise, the following description for the operation of the detonator delay circuits can be carried out by conventional programming for the circuit 42 or through conventional logic design for the circuit 42.

Referring now to FIGS. 15a-15e, there is described the operation for the detonator delay circuits. Upon receipt of power, each of the delay circuits enters a power up operation 380. The delay circuit enters a first question block 382 for detecting a front porch. The front porch is the leading portion of a signal transmission for both an address and a command. A front porch is a conventional signal transmission technique utilized in data communication. There is likewise a unique back porch signal for each address and command. Further referring to block 382, if the front porch signal is not detected, the NO exit is taken to return to the input of block 382. If the front porch signal is detected, the YES exit is taken to a question block 384. This block inquires to determine if the delay circuit has received an address. If the answer is NO, the program returns to the question block 382. If the answer is YES, the delay circuit transitions to a question block 386. The block 386 inquires to determine if the received address corresponds to the particular delay circuit. If the delay circuit has received its address, "my address," the YES exit is taken to a question block 388. If the address for the particular delay circuit has not been received, the NO exit is taken to a question block 390.

If the delay circuit has received a broadcast address, the program transitions from the question block 390 through the YES exit to the question block 388. If a broadcast address has not been received, the NO exit is taken to return to the question block 382.

In question block 388, the delay circuit determines if a valid command has been received. If not, the NO exit is taken to return to the question block 382. If a valid command has been received, the YES exit is taken to a question block 392. Within the block 392, the delay circuit examines the received signal to detect a back porch signal component. If such a signal component is not detected, the NO exit is taken to return the operation of the delay circuit to the question block 382. If the correct back porch signal component is detected, the delay detonator circuit transitions through the YES exit of question block 392 to a question block 394.

If the type of received command is "program", the YES exit is taken to point A. If the program command has not been received, the NO exit is taken to return the delay circuit operation to the question block 382. The point A, for continued description, is located in FIG. 15b.

Referring now to FIG. 15b, transition through point A leads to a question block 396. Within the block 396, the delay detonator circuit again examines the incoming signal to detect the front porch signal portion. If this front porch signal component is not detected, control is returned to the input of block 396. If the front porch signal component is detected, the delay circuit operation transitions through the YES exit to a question block 398.

Within the question block 398, the delay circuit examines the incoming signal to determine if an address has been received. If an address has been received, the YES exit is taken to a question block 400. If an address has not been received, the NO exit is taken and control is returned to the question block 396.

Within the question block 400, the delay detonator circuit determines if its particular address has been received. If its address has been received, the YES exit is taken to the input of a question block 402. If the particular address for the delay circuit has not been received, the NO exit is taken from question block 400 and control is transferred to a question block 404.

Within question block 404, a determination is made if a broadcast address has been received. If such an address has not been received, the NO exit is taken and control is returned to the question block 396. If a broadcast address has been received, the YES exit is taken and control is transferred to the question block 402.

Within the question block 402, the delay circuit determines if delay data has been received. If not, the NO exit is taken from block 402 and control is returned to the question block 396. If delay data has been received, the YES exit is taken to a question block 406. The function of block 406 is to detect the back porch signal component. If this signal component is not detected, the operation is returned to the question block 396. If the back porch component is detected, the YES exit is taken to an operation block 408. Within the block 408, the delay detonator circuit stores the delay data it has received. From the store data operation block 408, the control of the delay circuit is transferred to a point B. Point B is further located in FIG. 15c.

Figures 15C, 15D:
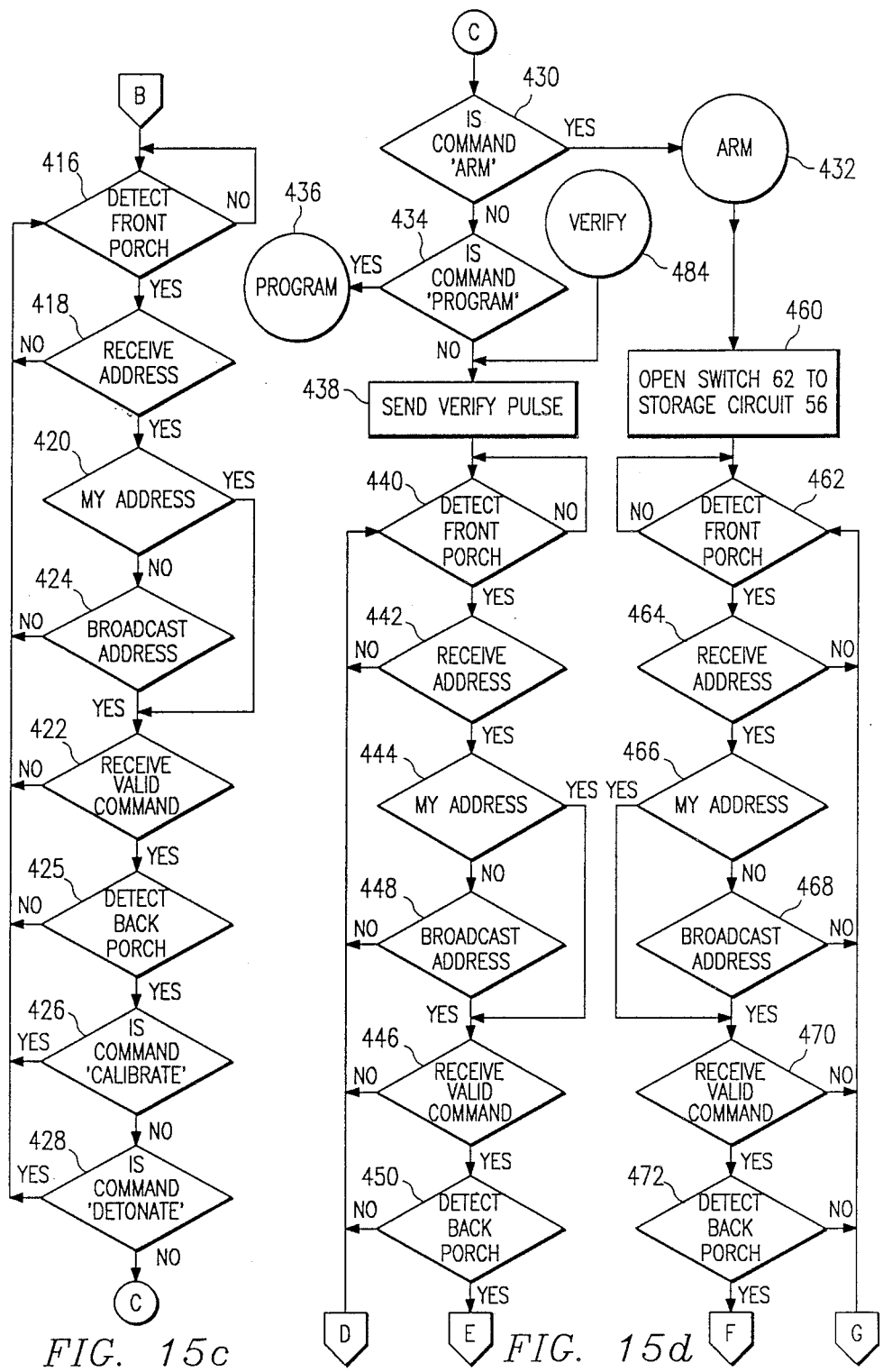

Referring now to FIG. 15c, from point B, the control for the delay circuit enters a question block 416. Within the block 416, the delay circuit seeks to detect the front porch signal component. When this signal component is not detected, control is returned to the input of the block 416. If the front porch signal component is detected, the control transitions through the YES exit to a question block 418.

The function of the block 418 is to determine if an address has been received. If not, the NO exit is taken to the question block 416. If an address has been received, the YES exit is taken to a question block 420. Within the block 420, the delay circuit determines if its particular address has been received. If so, control is transferred to the input of a question block 422. If the address received is not for the particular delay detonator circuit, the NO exit is taken to a question block 424.

Within the block 424, an examination is made to determine if a broadcast address has been received. If not, the NO exit is taken and control is returned to the question block 416. If a broadcast address has been received, control is transferred through the YES exit to the question block 422.

Within the question block 422 the delay circuit determines if a valid command has been received. If not, control is transferred to the question block 416. If valid data has been received, the YES exit is taken to a question block 425.

Within the question block 425, the delay circuit determines if the back porch signal component has been detected. If this component has not been detected, the NO exit is taken to return control to the question block 416. If a correct back porch signal component has been detected, the YES exit is taken to a question block 426. The question block 426 determines if a calibrate command has been received. If a calibrate command has been received, control is transferred back to the question block 416 for again monitoring for the receipt of a front porch signal component. If the received command is not "calibrate", the NO exit is taken to a question block 428. Within the question block 428, the delay circuit determines if the received command is for "detonate." If this is the received command, control is returned to the question block 416. If this is not the received command, the NO exit is taken to point C, which is present in FIG. 15d. The calibrate and detonate commands are incorrect at this point in the program sequence.

Referring now to FIG. 15d, the description for the operation of the delay circuit is continued. From point C, control for the delay circuit is transferred to question block 430. Within the block 430, the circuit determines if the received command is for "ARM." If so, the YES exit is taken to the arm operation 432. If the command is not "ARM", the NO exit is taken to a question block 434.

Within the block 434, the delay circuit determines if the received command is "PROGRAM." If so, the YES exit is taken to the program operation 436. The program operation 436 further occurs in FIG. 15b. If the received command is not "PROGRAM" in question block 434, the NO exit is taken to an operation block 438. In block 438, the delay detonator circuit sends a verify pulse back to the control unit 12.

Following the operation block 438, the control of the delay circuit transfers to a question block 440. Within the block 440, the delay circuit again seeks to detect a front porch signal component. If this signal component is not detected, control is transferred to the NO exit back to the input of block 440. If the front porch signal component is detected, the YES exit is taken to a question block 442.

Within the block 442, the delay circuit determines if an address has been received. If so, the YES exit is taken to a question block 444. If an address has not been received, the NO exit is taken and control is returned to the question block 440 to resume detection for a front porch signal component.

Within the control block 444, the delay circuit makes a comparison of the received address to its stored address to determine if the received address corresponds to that of the receiving delay detonator circuit. If so, the YES exit is taken and control is transferred to a question block 446. If the delay circuit address has not been received, the NO exit is taken and control is transferred to a question block 448. Within the block 448, a determination is made if a broadcast address has been received if so, the YES exit is taken to the question block 446. If not, the NO exit is taken and control is returned to the question block 440.

Within the question block 446, the delay circuit determines if a valid command has been received. If so, the YES exit is taken to a question block 450. If a valid command has not been received, the NO exit is taken and control is returned to the question block 440.

The delay detonator circuit determines in question block 450 whether a back porch signal component has been detected. If so, the control is transferred to point E. If not, control is transferred through the NO exit to the input of the question block 440.

Point E is present in FIG. 15e. Further continuing the description of the operation for the delay circuit in FIG. 15d, if the output of the question block 430 indicates that the received command is "ARM", the YES exit is taken and control is transferred to an operational block 460.

Within the block 460, the delay circuit opens the switch 62 to the storage circuit 56. This is a safety feature which insures that there is no transfer of energy between the storage circuit 56 and the fuse 68 until desired.

From the operational block 460, control is transferred to a question block 462 to again detect a front porch signal component. If such a signal component is not detected, the NO exit is taken to return control to the input of block 462. If a front porch signal component is detected, the YES exit is taken to a question block 464. The block 464 determines if an address has been received. If so, the YES exit is taken to a question block 466. If not, the control is returned through the NO exit to the question block 462.

Within the question block 466, the delay circuit determines if its particular address has been received. If not, control is transferred through the NO exit to the question block 468. If the particular delay circuit address has not been received, control is transferred through the YES exit to a question block 470.

Within the question block 468, the delay circuit determines if a broadcast address has been received. If not, control is transferred back to the question block 462. If so, control is transferred through the YES exit to the question block 470. Within the question block 470, the delay circuit determines if a valid command has been received. If not, control is transferred back to the question block 462 for further detect monitoring to detect a front porch signal component. If a valid command has been received, control is transferred through the YES exit to a question block 472.

Within the block 472, the delay circuit performs the function of detecting the receipt of the back porch signal component. If this signal component is not detected within a set time, control is returned to the question block 462. If the back porch signal component is properly detected, control is transferred to point F. The point F is further located in FIG. 15e.

Referring to FIG. 15, from point E, the control for the delay circuit enters a question block 480. Within this block, the circuit determines if the received command is for "PROGRAM." If so, the YES exit is taken to the program operation 436. If not, the NO exit is taken to transfer control to a question block 482. Within the block 482, the delay circuit determines if the received command is "VERIFY." If so, the YES exit is taken to the verify operation 484. If not the NO exit is taken, control is transferred to a question block 486.

Within the question block 486, the delay detonator circuit determines if the received command is "CALIBRATE." If so, the YES exit is taken through point D back to the question block 440, shown in FIG. 15d. If the "CALIBRATE" command has not been received, the NO exit is taken to a question block 488.

Within the question block 488, the circuit determines if the received command is "ARM." If not, control is returned to the question block 440. If so, the YES exit is taken to the arm operation 432, which is shown in FIG. 15d.

The F point from FIG. 15d transfers to FIG. 15e and enters a question block 494. Within this block, the delay circuit determines if the received command is "PROGRAM." If so, the control is transferred to the program operation 436. If not, control is transferred to a question block 496.

Within the block 496, the delay circuit determines if the received command is "VERIFY." If so, control is transferred through point G back to the question block 462 in FIG. 15d for further monitoring to detect the front porch signal component. If not, the NO exit is taken to a question block 498.

Within the question block 498, the delay circuit determines if the received command is for "CALIBRATE." If so, control is transferred to the calibrate operation 500. FIGS. 16 and 17 describe embodiments A and B for the calibrate operation carried out in the delay circuits. If the calibrate command is not received in block 498, the NO exit is taken to a question block 502. Within the block 502, the delay circuit determines if the received command is for "ARM." If so, control is transferred to the arm operation 432. If not, control is transferred to a question block 504.

Within the block 504, the delay circuit determines if the received command is for "DETONATE." If so, control is transferred to the detonate operation 506, which is further described in FIG. 18. If not, control is transferred back through point G to the question block 462 for further awaiting the detection of the front porch signal component.

Referring now to FIG. 16, there is illustrated the operation of the delay circuit for the embodiment A of the present invention. This corresponds to the embodiment A blast mode 232 described above in reference to FIG. 13. In the calibrate operation 500, the first step is a question block 510. In block 510, the delay circuit determines if a calibrate pulse has been detected. If not, control is transferred through point D back to the front porch detection question block 440 in FIG. 15d. If the calibration pulse is detected, control is transferred through the YES exit to an operation block 512.

A number of operations are carried out within the operational block 512 by the delay circuit. These operations serve to produce a corrected delay count through computations carried out within the delay circuit itself. No further communication is required between the delay circuit and the control unit 12. The first step within the operation of block 512 is to measure the duration of the calibration pulse. This is done by counting the output of the local oscillator 76. There is previously stored in the delay detonator circuit an ideal count corresponding to the count that would be produced from a perfectly calibrated oscillator. The reference count, measured during the calibration pulse, is subtracted from the ideal oscillator count. The difference is multiplied by the stored delay count, which is the count for the required delay time for a precision oscillator. The resulting product is divided by the reference count. The particular technique is to shift by N bits. The result of the division operation is added to the store delay count to create an adjusted delay count. The adjusted delay count is then stored. Following the operational block 512, control is returned via point D to the question block 440 for further detecting the front porch signal component. After the calibration procedure is completed at the delay circuit, the circuit then awaits the arm and detonate commands described above.

The embodiment B operation for the delay circuit is illustrated in FIG. 17. In the calibrate operation 500, the first step is a question block 514. Within the block 514, the delay circuit determines if a calibration pulse has been detected. If not, control is transferred through the NO exit via point D back to question block 440. If a calibration pulse has been detected, control is transferred through the YES exit to an operational block 516. Within the block 516, the delay circuit measures a count of the output of its local oscillator 76 during the calibration pulse. This count is then transmitted from the delay circuit back to the control unit 12. Control is then transferred from the operational block 516 via point D back to the question block 440 in FIG. 15d. As described above for embodiment B of the blast mode 232 in FIGS. 14a and 14b, the control unit 12 performs the calculations to determine a corrected delay count and this count is then transmitted to the corresponding delay circuit.

As described above for embodiment B, the control unit 12 utilizes the count received from the delay circuit to calculate a corrected delay count. This corrected delay count is then transmitted with an appropriate command to the corresponding delay circuit and the corrected delay count is stored in the register/comparator circuit 88. Upon receipt of a detonate command, as described above, the comparison process is begun until the counts match and the fuse is ignited in the manner described above.

The detonate operation 506 is described in reference to FIG. 18 for the delay detonator circuit. Upon entry of the delay operation 506, the delay circuit enters an operational block 520. Within this block, the delay circuit activates the switch 62 to transfer stored energy from the energy storage circuit 56 into the fuse 68 which serves to ignite the fuse thereby igniting the proximate explosives.

The corrected delay counts which are either generated within the delay circuits or transmitted to the delay circuits can be the absolute delay time for the delay circuits or a relative delay time.

In summary, the present invention sets forth methods and apparatus for calibrating a delay circuit within a blasting system. A universal calibration pulse is transmitted from a control unit to all of the individual delay circuits to calibrate the local oscillators therein, which local oscillators may not have a precise rate. A correction factor is calculated either at the delay circuit or at the control unit and this is in turn used to scale the individual delay counts provided to each of the delay circuits.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

We claim:

1. A method for calibrating an electronic delay for a delay detonation system having a control unit and a plurality of delay ignition circuits, each having a local oscillator, comprising the steps of:
   transmitting a calibration interval from said control unit concurrently to each of said delay ignition circuits,
   counting an output of a local oscillator at each of said delay ignition circuits during said calibration interval to produce a local oscillator count for each said delay ignition circuit,
   transmitting said local oscillator counts from each of said delay ignition circuits to said control unit,
   computing a corrected delay count at said control unit for each of said delay ignition circuits, said corrected delay count being a function of selected delay for the corresponding delay ignition circuit, the local oscillator count received from the corresponding delay circuit and a predetermined reference count, and
   transmitting said corrected delay counts from said control unit respectively to each of said delay ignition circuits, wherein said corrected delay count for each delay ignition circuit represents a delay time for that delay ignition circuit.

2. A method for calibrating an electronic delay for a delay detonation system as recited in claim 1 wherein said step of transmitting a calibration interval comprises transmitting a calibration pulse having a leading edge which initiates counting the output of the local oscillator and having a trailing edge which terminates counting the output of the local oscillator.

3. A method for calibrating an electronic delay for a delay detonation system as recited in claim 1 wherein said step of transmitting said local oscillator counts comprises transmitting each said local oscillator count as a digital word which is the output count from the corresponding local oscillator.

4. A method for calibrating an electronic delay for a delay detonation system having a control unit and a delay ignition circuit, comprising the steps of:
   transmitting a calibration interval from said control unit to said delay ignition circuit,
   counting an output of a local oscillator at said delay ignition circuit during said calibration interval to produce a local oscillator count,
   transmitting said local oscillator count from said delay ignition circuit to said control unit,
   computing a corrected delay count at said control unit for said delay ignition circuit, said corrected delay count being a function of a selected delay for the delay ignition circuit, the local oscillator count received from the delay ignition circuit and a predetermined reference count, and
   transmitting said corrected delay count from said control unit to said delay ignition circuit, wherein said corrected delay count for said delay circuit represents a delay time for the delay ignition circuit.

5. A method for calibrating an electronic delay for a delay detonation system as recited in claim 4 wherein said step of transmitting a calibration interval comprises transmitting a calibration pulse having a leading edge which initiates counting the output of the local oscillator and having a trailing edge which terminates counting the output of the local oscillator.

6. A method for calibrating an electronic delay for a delay detonation system as recited in claim 4 wherein said step of transmitting said local oscillator count comprises transmitting said local oscillator count as a digital word which is the output count from the local oscillator.

7. A method of operation for a blasting system having a control unit connected to a plurality of spaced apart delay ignition circuits, each having a unique address and a fuse for igniting an adjacent explosive, the method comprising the steps of:
   storing in said control unit a table of addresses for said delay ignition circuits and a delay time for each delay ignition circuit,
   transmitting a broadcast address and a negative verify command from said control unit concurrently to all of said delay ignition circuits,
   monitoring by said control unit to detect a response from any one of said delay ignition circuits, and proceeding with the following steps if no response is received for said transmitted negative verify command within a preset time,
   transmitting a calibration interval concurrently to all of said ignition delay circuits,
   counting the output of a local oscillator in each of said delay ignition circuits to produce a calibration count in each said delay ignition circuit,
   producing a corrected delay count for each of said delay ignition circuits as a function of said local oscillator count, a pre-determined delay time for each delay ignition circuit and a reference count,
   transmitting a broadcast detonate command concurrently to each of said delay ignition circuits, and
   upon receipt of said detonate command, each of said delay ignition circuits firing its fuse after a time delay corresponding to the corrected delay count for that delay ignition circuit.

8. A method for calibrating an electronic delay for a delay detonation system as recited in claim 7 wherein said step of transmitting a calibration interval comprises transmitting a calibration pulse having a leading edge which initiates counting the output of the local oscillator and having a trailing edge which terminates counting the output of the local oscillator.

9. A method for calibrating an electronic delay for a delay detonation system as recited in claim 7 wherein said step of producing a corrected delay count for each of said delay ignition circuits is carried out at said control unit and the corrected delay count is transmitted from the control unit to each of the delay ignition circuits.

10. A method for calibrating an electronic delay for a delay detonation system as recited in claim 7 wherein said step of producing a corrected delay count for each of said delay ignition circuits is carried out at the corresponding one of said delay ignition circuits.

11. A method of operation for a blasting system having a control unit connected to a plurality of spaced apart delay ignition circuits, each having a unique address and a fuse for igniting an adjacent explosive, the method comprising the steps of:

storing in said control unit a table of addresses for said delay ignition circuits and a delay time for each delay ignition circuit, transmitting sequentially from said control unit to each of said delay ignition circuits the unique address for each of said delay ignition circuits together with a positive verify command, monitoring by said control unit to detect a response from each of said delay ignition circuits, and proceeding with the following steps if a verify response is received within a preset time from each of said delay ignition circuits, transmitting a calibration interval concurrently to all of said ignition delay circuits, counting the output of a local oscillator in each of said delay ignition circuits to produce a calibration count in each said delay ignition circuit, producing a corrected delay count for each of said delay ignition circuits as a function of said local oscillator count, a preset delay time for each delay ignition circuit and a reference count, transmitting a broadcast detonate command concurrently to each of said delay ignition circuits, and upon receipt of said detonate command, each of said delay ignition circuits firing its fuse after a time delay corresponding to the corrected delay count for that delay ignition circuit.

12. A method for calibrating an electronic delay for a delay detonation system as recited in claim 11 wherein said step of transmitting a calibration interval comprises transmitting a calibration pulse having a leading edge which initiates counting the output of the local oscillator and having a trailing edge which terminates counting the output of the local oscillator.

13. A method for calibrating an electronic delay for a delay detonation system as recited in claim 11 wherein said step of producing a corrected delay count for each of said delay ignition circuits is carried out at said control unit and the corrected delay count is transmitted from the control unit to each of the delay ignition circuits.

14. A method for calibrating an electronic delay for a delay detonation system as recited in claim 11 wherein said step of producing a corrected delay count for each of said delay ignition circuits is carred out at the corresponding one of said delay ignition circuits.

15. A method for calibrating an electronic delay for a delay detonation system as recited in claim 11 wherein said verify response is a pulse transmitted from said delay ignition circuits to said control unit.

* * * * *